United States Patent
Liu

(10) Patent No.: US 8,495,462 B1
(45) Date of Patent: Jul. 23, 2013

(54) ABSORB DECODE ALGORITHM FOR 10GBASE-T LDPC DECODER

(71) Applicant: Marvell International Ltd., Hamilton (BM)

(72) Inventor: Zhenyu Liu, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/738,325

(22) Filed: Jan. 10, 2013

Related U.S. Application Data

(63) Continuation of application No. 13/269,446, filed on Oct. 7, 2011, now Pat. No. 8,381,069, which is a continuation of application No. 12/015,159, filed on Jan. 16, 2008, now Pat. No. 8,051,363.

(60) Provisional application No. 60/885,130, filed on Jan. 16, 2007.

(51) Int. Cl.
$H03M\ 13/11$ (2006.01)

(52) U.S. Cl.
USPC .................................... 714/759; 714/785

(58) Field of Classification Search
USPC ...................................... 714/752, 759, 785
See application file for complete search history.

(56) References Cited

U.S. PATENT DOCUMENTS

| | | | | |
|---|---|---|---|---|
| 6,848,069 B1 * | 1/2005 | Levy et al. | | 714/755 |
| 7,400,774 B2 * | 7/2008 | Puri et al. | | 382/238 |
| 7,441,178 B2 | 10/2008 | Xin | | |
| 7,653,862 B2 | 1/2010 | Hassner et al. | | |
| 7,716,553 B2 | 5/2010 | Kim et al. | | |
| 7,814,402 B2 | 10/2010 | Gaudet et al. | | |
| 8,051,363 B1 * | 11/2011 | Liu | | 714/780 |
| 8,381,069 B1 * | 2/2013 | Liu | | 714/759 |
| 2006/0190797 A1 | 8/2006 | Xin | | |
| 2007/0033484 A1 | 2/2007 | Kim et al. | | |
| 2009/0217138 A1 * | 8/2009 | Touzni et al. | | 714/776 |

OTHER PUBLICATIONS

Part 3: Carrier Sense Multiple Access with Collision Detection (CSMA/CD) Access Method and Physical Layer Specifications Amendment 1: Physical Layer and Management Parameters for 10 Gb/s Operation, Type 10GBASE-T, IEEE Std 802.3an™-2006 (Amendment to IEEE Std 802.3™-2005) pp. 1-167 (Sep. 2006).

* cited by examiner

*Primary Examiner* — Stephen M Baker

(57) ABSTRACT

Systems and methods are provided for correcting absorb sets and near absorb sets in the (2048, 1723) LDPC code used in 10 GBase-T transmission systems. Absorb sets and near absorb sets correspond to error patterns that, due to the structure and imperfections of the LDPC code, cannot easily be corrected using standard correction methods. To correct these error patterns, a set of failed syndrome checks associated with the error pattern can be identified, and the 4, 8, 12, or 16 error patterns associated with the failed syndrome checks can be determined. The codeword may then be corrected based on the error pattern that most likely occurred.

20 Claims, 19 Drawing Sheets

Base =

| 0 | 0 | 0 | 0 | 0 | 0 | 0 | 0 | 0 | 0 | 0 | 0 | 0 | 0 | 0 | 0 | 0 | 0 | 0 | 0 | 2 |
|---|---|---|---|---|---|---|---|---|---|---|---|---|---|---|---|---|---|---|---|---|
| 17 | 6 | 33 | 51 | 9 | 54 | 2 | 4 | 52 | 4 | 7 | 37 | 45 | 5 | 20 | 30 | 27 | 70 | 15 | 27 | 33 | 15 | 52 | 9 | 58 | 11 | 14 | 25 | 1 | 37 | 59 |

Shift =

| 0 | 0 | 0 | 0 | 0 | 0 | 0 | 0 | 0 | 0 | 0 | 0 | 0 | 0 | 0 | 0 | 0 | 0 | 0 | 0 | 0 |
|---|---|---|---|---|---|---|---|---|---|---|---|---|---|---|---|---|---|---|---|---|
| 17 | 37 | 42 | 37 | 2 | 50 | 37 | 13 | 47 | 27 | 49 | 5 | 39 | 59 | 33 | 31 | 37 | 53 | 38 | 20 | 9 | 29 | 14 | 21 | 17 | 43 | 27 | 47 | 28 | 29 | 0 |
| 34 | 11 | 23 | 11 | 4 | 39 | 9 | 27 | 31 | 54 | 33 | 10 | 13 | 53 | 1 | 72 | 9 | 41 | 15 | 40 | 18 | 58 | 28 | 42 | 32 | 21 | 54 | 29 | 57 | 58 | 2 |
| 7 | 22 | 46 | 22 | 8 | 13 | 18 | 52 | 62 | 47 | 1 | 20 | 26 | 41 | 2 | 63 | 18 | 17 | 30 | 19 | 36 | 55 | 56 | 23 | 3 | 42 | 47 | 58 | 51 | 55 | 4 |
| 14 | 44 | 31 | 44 | 16 | 26 | 36 | 43 | 63 | 29 | 2 | 40 | 52 | 17 | 4 | 61 | 36 | 34 | 60 | 38 | 11 | 45 | 51 | 46 | 6 | 23 | 29 | 55 | 37 | 45 | 8 |
| 28 | 27 | 62 | 27 | 32 | 52 | 11 | 21 | 61 | 58 | 4 | 19 | 43 | 34 | 8 | 57 | 11 | 7 | 59 | 15 | 22 | 25 | 37 | 31 | 12 | 46 | 58 | 45 | 9 | 25 | 16 |

FIG. 10

ABSORB DECODE ALGORITHM FOR 10GBASE-T LDPC DECODER

CROSS-REFERENCE TO RELATED APPLICATION

This application is a continuation of U.S. patent application Ser. No. 13/269,446, filed Oct. 7, 2011 (currently allowed), which is a continuation of U.S. patent application Ser. No. 12/015,159, filed Jan. 16, 2008 (now U.S. Pat. No. 8,051,363), which claims the benefit under 35 U.S.C. §119(e) of U.S. Provisional Application No. 60/885,130, filed Jan. 16, 2007 (now expired). Each of U.S. patent application Ser. No. 13/269,446, U.S. patent application Ser. No. 12/015,159, and U.S. Provisional Application No. 60/885,130 is incorporated herein by reference in its respective entirety.

BACKGROUND

The disclosed technology relates generally to error correction in digital communications systems, and more particular, to error correction of particular error patterns that are not correctable by conventional means.

Currently, the most common standards for Ethernet communications allow for connections of up to 1 gigabit/second (Gb/s). However, with the increasing demand for high-speed Ethernet communications, the 10 GBase-T standard for 10 Gb/s transmission was developed, and has the potential in the near future to become widely used in the communications industry. The 10 GBase-T standard defines specifications for communications over conventional unshielded or shielded twisted pair cables, and for distances of at up 100 meters.

As communications speeds increase, the importance of high quality detection and decoding in receivers increases drastically. For reliable communication, it is necessary for receivers to be able to accurately detect and correct errors in data communicated over these Ethernet systems. The 10 GBase-T standard specifies a particular low-density parity check (LDPC) code with a block size of 2048 bits and 325 parity bits. However, current decoding techniques for this LDPC code, such as min-sum decoding, might not be able to correct errors when certain patterns of errors occur. For example, due to limitations of the LDPC code, certain error patterns may include bit errors that effectively cancel each other out in syndrome computation, which may render a standard decoding technique unable to detect the presence of errors at all. When these types of error patterns occur, current decoding techniques may incorrectly decode the transmitted information, possibly increasing the number of errors present.

SUMMARY

Therefore, systems and methods are provided for performing error correction when errors occur in a received codeword that effectively cancel each other out. These systems and methods may be particularly effective for decoding in 10 GBase-T Ethernet devices.

10 GBase-T Ethernet devices may use a (2048, 1723) low-density parity check (LDPC) code to ensure transmission reliability. In particular, an Ethernet device may include a transmitter and receiver for transmitting and receiving digital information. The transmitter may include an LDPC encoder to encode the digital information into a codeword in the LDPC domain. The receiver may include an LDPC decoder to convert the received codeword back into digital information, and ideally corrects any errors that occurred during transmission.

The LDPC decoder may include a conventional LDPC decoder and an absorb set decoder. The conventional decoder can employ a standard LDPC decoding algorithm, such as a min-sum algorithm or another iterative decoding algorithm to correct errors in the received codeword. The resulting corrected codeword produced by the conventional LDPC decoder may be referred to as a tentative codeword. In some scenarios, the tentative codeword may be used directly to obtain an estimate of the transmitted/stored digital information. In other scenarios, the tentative codeword may be corrected further by the absorb set decoder.

The absorb set decoder may be configured to correct absorb sets and near absorb sets. Absorb sets and near absorb sets are examples of sets of errors that may remain in the tentative codeword even after correction by the conventional LDPC decoder. That is, due to code limitations, absorb sets may not be correctable by the standard decoding methods employed by the conventional LDPC decoder. In order for the absorb set decoder to identify and correct absorb set bit errors, the LDPC decoder (e.g., the conventional LDPC decoder or the absorb set decoder) may compute a set of checks that are each associated with a set of bits in the tentative codeword. A similar set of checks may have been used by the conventional LDPC decoder. The checks can provide an indication as to whether errors, such as an absorb set, are present in the tentative codeword. As used herein, an absorb set for the (2048, 1723) LDPC code refers to a set of eight incorrectly received bits in a tentative codeword that have the following properties: the bits are checked by 28 checks defined by the LDPC code, where eight of the checks fail and the remaining 20 checks are satisfied, and each of the eight error bits are checked by five satisfied checks and a different one of the eight failed checks. A near absorb set refers to a set of bit errors similar in structure to those in the absorb set, but where at least one of the eight bits is correctly received.

Because each error bit in an absorb set is connected to five satisfied checks and one failed check, the conventional LDPC encoder may incorrectly conclude that all eight bits are error-free. Thus, the five satisfied checks reinforce the errors, causing difficulty in determining the positions of error bits. A similar phenomenon occurs for near absorb sets, but to a lesser degree. Thus, the absorb set decoders can detect the possible presence of absorb sets and near absorb sets in a tentative codeword, and can correct the tentative codeword based on the most likely absorb set error pattern. As used herein, an absorb set error pattern refers to an error pattern in the received information that results in an absorb set.

An absorb set decoder can include an absorb set detector for detecting when an absorb set or near absorb may be present in a tentative codeword. The detector examines the syndrome of the tentative codeword to determine whether there are up to eight failed checks that may have been caused by an absorb set error pattern. In particular, due to the structure of the LDPC code, the detector can identify the possible presence of an absorb set or a near absorb by determining when between five and eight failed checks (inclusive) have occurred within one, and only one, 64-bit block of the 384-bit syndrome. When this occurs, the failed checks in the 64-bit syndrome block are potentially the failed checks associated with the absorb set or near absorb set.

Once the possible presence of an absorb set or near absorb set is detected, the absorb set decoder can obtain a set of coefficients, referred to as the base, that fully represents the location of the eight failed checks within the 64-bit syndrome block. Due to the structure of the LDPC code, the absorb set decoder can select five of the failed checks for use in obtaining this location information. The remaining three checks are derivable from the selected five, and therefore do not add any additional information. Because only five failed checks are needed, the absorb set decoder is capable of correcting not only absorb sets, but also near absorb sets that have at least five bit errors.

The absorb set decoder can also include an absorb set lookup table implemented using, for example, read only memory (ROM). The absorb set table may be pre-stored with a plurality of bit combinations, where each bit combination includes eight bits that, if they were to fail, would cause an absorb set. The absorb set table may be indexed by the location information of the checks within a 64-bit syndrome block, as well as a block index that is representative of the location of the 64-bit syndrome block within the 384-bit syndrome. From this information on the checks, the absorb set table can provide one or more bit error combinations that may have affected the received codeword. Thus, the absorb set table associates combinations of checks with combinations of bits, and can be used to convert a set of known checks to possible absorb set bit errors.

From the bit combinations provided by the absorb set table, the absorb set decoder can derive further bit combinations such that a total of 4, 8, 12, or 16 bit combinations may be obtained. The absorb set decoder can determine which of these bit combinations is the most likely bit combination to have affected the received codeword. Absorb set decoder can compute a likelihood metric for each of the 4, 8, 12, or 16 possible bit combinations, and can correct the tentative codeword based on bit combination with the greatest likelihood. Correcting the tentative codeword may involve flipping the bits of the tentative codeword at the locations specified by the most likely bit combination, and performing a majority logic decode on the resulting codeword. The majority logic code may correct any possible remaining bit errors in the tentative codeword.

Thus, in one embodiment of the present invention, an absorb set decoder is provided for correcting an absorb set from a tentative codeword using a syndrome composed of a plurality of checks. The absorb set decoder may be included in a low-density parity check (LDPC) code decoder employing a (2048, 1723) LDPC code based on the 10 GBase-T standard. Each bit error in the absorb set affecting the tentative codeword may be associated with a check in the syndrome. The absorb set decoder can include means for determining whether the checks that fail in the syndrome possibly correspond to checks of the absorb set. The syndrome may be grouped into distinct blocks (e.g., six blocks of 64 bits each in a 384-bit syndrome), and the means for determining whether the checks that fail in the syndrome can include means for determining whether only one of the distinct blocks includes a predetermined number of checks (e.g., five checks) that fail.

The absorb set decoder can further include means for determining subspace information from the checks that fail. The subspace information can at least partially represent the checks of the absorb set. In one embodiment, the means for determining subspace information can include means for selecting a predetermined number of the checks that fail in the syndrome and means for identifying the subspace information based on the predetermined number of checks. The absorb set decoder can also include means for obtaining a plurality of bit combinations associated with the subspace information, where the bit combinations correspond to bit positions in the tentative codeword that form a particular absorb set when errors occur at the bit positions.

To correct the tentative codeword, the absorb set decoder can include means for correcting the tentative codeword based on the bit combination with greatest likelihood. The means for correcting the tentative codeword can include means for calculating a likelihood for each of the plurality of bit combinations, where the likelihood for a bit combination is indicative of the probability that the bit combination is present in the tentative codeword. To complete the correction of the tentative codeword, the means for correcting the tentative codeword can also include means for identifying the bit combination with the greatest likelihood, means for flipping bits of the tentative codeword at the bit positions specified by the bit combination with the greatest likelihood to produce a corrected codeword, and means for performing a majority decode on the corrected codeword to produce a recovered codeword.

In another embodiment of the present invention, an absorb set decoder is provided for reconstructing subspace information for checks associated with an absorb set and correcting absorb set error patterns, where the checks are located within a syndrome of a tentative codeword. The absorb set decoder can include means for selecting a predetermined number of checks that fail (e.g., five checks) from the syndrome, where each of the predetermined number of checks is associated with a check index that indicates the location of the check within the syndrome. This can include means for selecting failed checks from within a distinct block of the syndrome, where the distinct block is also of a predetermined size (e.g., 64-bit block). The absorb set decoder can also include means for selecting one of the predetermined number of checks as the coset leader, where the check indices of the remaining checks in the predetermined number of checks are expressible in terms of the check index of the coset leader.

To form a set of modified check indices, the absorb set decoder can include means for removing the check index of the coset leader from expressions for the check indices of the remaining checks. The absorb set decoder can identify a linearly independent subset of the modified check indices, and can include means for forming a reconstructed subspace from the linearly independent subset of modified check indices. For example, the linearly independent subset of modified checks can be represented by $d_1'$, $d_2'$, and $d_3'$, and the reconstructed subspace can include the values, $\{d_1', d_2', d_1' \oplus d_2', d_3', d_1' \oplus d_3', d_2' \oplus d_3', d_1' \oplus d_2' \oplus d_3'\}$. The absorb set decoder can include means for identifying a linearly independent set of values from the reconstructed subspace that form a basis of the reconstructed subspace, and can include means for correcting the absorb set based on the linearly independent set of values.

In still another embodiment of the present invention, an absorb set decoder is provided for correcting absorb sets in a tentative codeword based on a reconstructed subspace, where the reconstructed subspace at least partially represents checks that fail in a syndrome corresponding to the tentative codeword. The absorb set decoder can include means for computing a first permutation of check indices based on the reconstructed subspace and means for determining a first set of locations of possible bit errors in the tentative codeword based on the first permutation. The absorb set decoder can also include means for computing a second permutation of the check indices based on the reconstructed subspace and means for determining a second set of locations of possible bit errors in the tentative codeword based on the second permutation. The second permutation can include the same check indices as the first permutation but arranged in a different order, and both the first and second permutations may be associated with the same set of bit indices. To correct the tentative codeword, the absorb set decoder can include means for correcting the tentative codeword based on either the first or the second set of locations, which can include means for determining which set of locations more likely is present in the tentative codeword and means for correcting the tentative codeword based on the bit positions of the more likely set.

In some embodiments, the means for computing the first permutation of check indices can include means for adding, in modulo-2, the reconstructed subspace to a first of the check indices. The means for computing the second permutation of check indices can similarly include means for adding, in modulo-2, the reconstructed subspace to a second of the check indices different from the first. In some embodiments, the means for computing the first permutation can instead or can also include means for performing a lookup in to an absorb set table for bit indices associated with the reconstructed subspace, where each bit index is associated with a particular check derivable from the reconstructed subspace and indexes to a particular bit in an absorb set that is checked by the particular check, and means for converting each bit index associated with the reconstructed subspace to a particular bit position in the tentative codeword.

In still another embodiment of the present invention, an absorb set decoder is provided with an absorb set table. The absorb set decoder can be implemented in an LDPC decoder, and can be used with the absorb set table to correct bit errors in a tentative codeword based on a syndrome for the tentative codeword. The absorb set table can include a plurality of sub-tables, a plurality of first entries in each sub-table, and a plurality of second entries in each sub-table. Each sub-table may be associated with a distinct block (e.g., 64-bit block) of the syndrome. Each of the first entries can include a set of modified check indices usable to produce a permutation of check indices, where the check indices indicate bit locations in the syndrome that fail when an absorb set is present. Each of the second entries can include a set of bit indices, where each bit index is associated with a particular check derivable from one of the first entries, and where each bit index indexes to a particular bit in an absorb set that is checked by the particular check.

The absorb set decoder can compute a first permutation of check indices from one of the first entries of the absorb set table, and can identify the location of each possible bit error in the tentative codeword based on the first permutation of the check indices. That is, the absorb set decoder may associate each check in the first permutation with a bit index from a set of bit indices in the plurality of second entries, and may convert each bit index associated with each check to a particular bit position in the tentative codeword. Similarly, the absorb set decoder can compute a second permutation of check indices from the one of the first entries of the absorb set table, and can identify the location of each possible bit error in the tentative codeword based on the second permutation of the check indices. The first permutation may be based on adding a reconstructed subspace to a first check index in modulo-2, the second permutation may be based on adding the reconstructed subspace to a second check index different from the first check index, where the first and second check indices are derivable from the modified check indices stored in the absorb set table.

BRIEF DESCRIPTION OF THE DRAWINGS

The above and other aspects and advantages of the invention will be apparent upon consideration of the following detailed description, taken in conjunction with the accompanying drawings, in which like reference characters refer to like parts throughout, and in which:

FIG. 10 shows a vector and matrix used by the bit index calculation unit of FIG. 8 to calculate the bit indices of likely bit errors;

DETAILED DESCRIPTION

Figure 1:
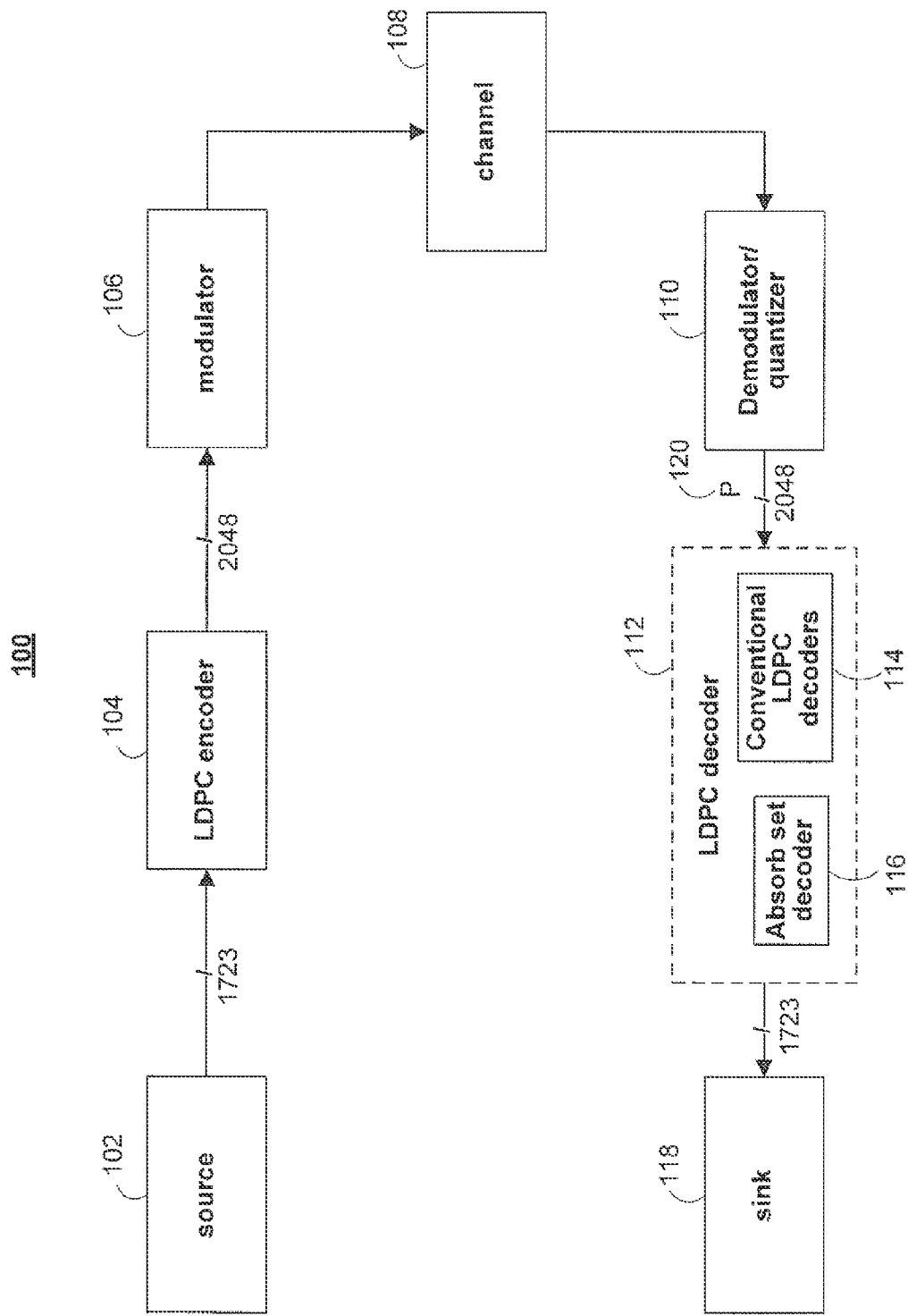
FIG. 1 shows a simplified block diagram of an illustrative digital communications system.

FIG. 1 shows a simplified and illustrative block diagram of digital communications system 100 that can employ the disclosed technology. In some embodiments, digital communications system 100 may represent a 10 GBase-T Ethernet communications system, and can include source 102, LDPC encoder 104, modulator 106, channel 108, demodulator/quantizer 110, LDPC decoder 112 and sink 118. It should be understood that the description of digital communications system 100 and its components below are merely illustrative, and that components may be added, modified, or removed from digital communications system 100 without departing from the scope of the present invention. For example, digital communications system 100 may include any additional components for properly encoding and decoding information in a 10 GBase-T communications system.

Digital communications system 100 may be used to transmit digital information from source 102 to sink 118. Source 102 may be any suitable source for storing or providing the digital information, and sink 118 may be any suitable destination for the provided digital information. For example, source 102 may be, but is not limited to, a source encoder, an encoder for an error correcting/detecting code (e.g., a convolutional encoder, a Reed-Solomon encoder, a CRC encoder, an LDPC encoder, a Turbo code encoder, etc.), a magnetic storage device (e.g., a hard disk), an electrical storage device (e.g., FLASH memory or RAM), or an optical storage device (e.g., a CD-ROM), and sink 118 may be a corresponding decoder or storage device. The digital information provided from source 102 to sink 128 can represent any type of information to be conveyed (e.g., a sampled/quantized version of an analog signal, binary information, etc.) and can be in any suitable digital form (e.g., encoded data, uncoded data, etc.).

The digital information may be transferred from source 102 to sink 118 using one or more information-carrying signals. The signals may be transferred using any suitable medium, represented in digital communications system 100 by channel 108. In some embodiments, channel 108 may be a shielded or unshielded twisted pair Ethernet cable of a suitable length (e.g., 5 meters, 10 meters, 100 meters). Also, the signals may be transferred through channel 108 at any of a variety of data rates (e.g., 100 Mbits/second, 1 Gbits/second, 10 Gbits/second, 100 Gbits/second). Because channel 108 may represent a cable of many meters, and the transmitted information may be transferred through it at a high data rate, channel 108 may severely degrade the information-carrying signal. Thus, the signal received by demodulator/quantizer 110 may be substantially different than the signal that was transmitted. To reliably transmit information through channel 108, an effective transmitter for preparing and transmitting the digital information is necessary, as well as a corresponding effective receiver for accurately interpreting the information from a received signal.

In FIG. 1, the transmitter in digital communications system 100 is embodied by LDPC encoder 104 and modulator 106. The receiver (described below) is embodied by demodulator/quantizer 110 and LDPC decoder 112. The LDPC encoder 104 may encode the digital information based on an (2048, 1723) LDPC code, such as the size-2048 LDPC code defined by the 10 GBase-T standard. That is, in this embodiment, LDPC encoder 104 encodes 1723 bits of digital information, which are directly or indirectly derived from source 102, and converts the bits into a 2048-bit codeword. The 2048-bit codeword may then be modulated for transmission through channel 108 by modulator 106. Modulator 106 can modulate each codeword produced by LDPC encoder 104 using a suitable modulation scheme, and may be based on the properties of the channel 108.

Demodulator/quantizer 110 can receive an altered version of the transmitted signal from channel 108, and demodulate the received signal. The soft or hard digital information corresponding to the 2048-bit codeword provided to LDPC decoder 112 may be referred to herein by the variable, P. LDPC decoder 112 decodes the codeword based on the same (2048, 1723) code used by LDPC encoder 104. This allows LDPC decoder 112 to recover the original digital information provided by source 102 if sufficiently few errors resulted from transmission through channel 108.

LDPC decoder 112 may include one or more conventional LDPC decoders 114 and absorb set decoder 116. The one or more conventional LDPC decoders 114 may operate on the received soft information, P. For example, if iterative decoding is used, multiple conventional LDPC decoders 114 may be cascaded, where each subsequent decoder after the first decoder can decode P based on the decoding result of a previous decoder. Conventional LDPC decoders 114 may decode the 2048-bit received codeword based on any suitable decoding algorithm, such as a min-sum, min-product, or majority logic decoding algorithm, or based on an algorithm derived from one or more of these algorithms. Using a suitable decoding algorithm, conventional LDPC decoders 114 may produce a corrected codeword, referred to herein as a tentative codeword. When conventional LDPC decoders 114 determines that the tentative codeword is correct, conventional LDPC decoders 114 may provide the tentative codeword as the output of LDPC decoder 112, or may provide the corresponding digital information obtained from the tentative codeword.

In some scenarios, the received soft information may have errors that are not easily correctable by conventional LDPC decoders 114. Therefore, the tentative codeword produced by conventional LDPC decoders 114 may still have errors. In these scenarios, absorb set decoder 116 may process the tentative codeword and attempt to remove these errors. To allow absorb set decoder 116 to process the tentative codeword, LDPC decoder 112 (e.g., conventional LDPC decoders 114) may compute 384 bits from the tentative codeword, referred to collectively as a "syndrome" or individually as "checks," which provide an indication as to whether errors are present in the tentative codeword.

Figure 2:
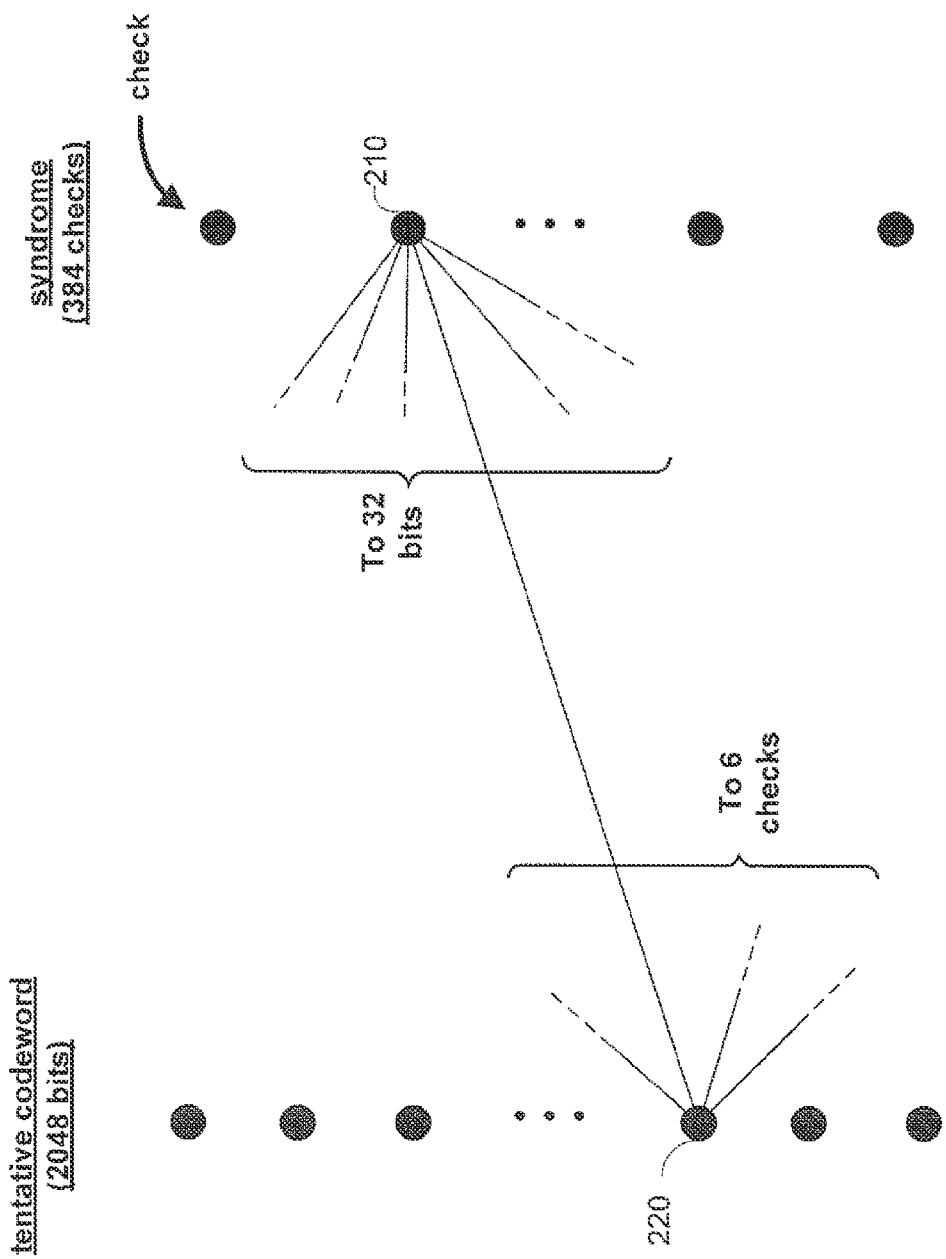
FIG. 2 shows a graphical representation of the relationship between tentative codeword bits and syndrome check bits in a (2048, 1723) LDPC code.

FIG. 2 shows a graphical representation of the relationship between the 2048 bits of a tentative codeword and the 384 checks of its corresponding syndrome. The left column of FIG. 2 illustrates the 2048 bits of the tentative codeword, and the right column of FIG. 2 illustrates the 384 checks of the syndrome. A line connecting a codeword bit in the left column to a check in the right column represents an association between a bit and a check. Thus, as illustrated for check 210 in FIG. 2, each check of the syndrome is associated with 32 bits of the tentative codeword. For each bit that check 210 is associated with (e.g., bit 220), check 210 can provide an indication as to whether errors are present amongst these 32 bits. Check 210 can take on one of two states: "failed" or "satisfied," where a failed check indicates that an error is present, while a satisfied check indicates that no error is likely present. Thus, if check 210 is satisfied, it provides an indication that bit 220 of the tentative codeword is likely correct.

With continuing reference to FIG. 2, for all of the checks in a syndrome to be associated with 32 bits in a codeword, each of the bits in the tentative codeword may be associated with six total checks. For example, bit 220 of the tentative codeword is associated with not only check 210, but also with five other checks in the syndrome. Therefore, each bit in the tentative codeword is "checked" by a total of six checks. For bit 220, or any other bit in the tentative codeword, these six checks may be any combination of failed or satisfied checks.

The syndrome (e.g., the checks in the right column of FIG. 2), however, is computed based on the tentative codeword, and can therefore provide misleading information about whether a bit is correct or incorrect. That is, check 210 of FIG. 2 is not only associated with bit 220 because it provides information on the correctness of bit 220, but the state (e.g., satisfied or failed) of the check itself depends on the value of bit 220. Each check may be computed, for example, by summing in modulo-2 the bits in a tentative codeword that it checks. If the 32 bits sum to zero, the check is considered satisfied, and if the bits sum to one, the check fails. Thus, a check can be satisfied even though errors are present. For example, if bit 220 and another bit associated with check 210 have errors, then check 210 can still be satisfied, thus providing misleading information about the correctness of bit 220. In fact, a check would be satisfied if any even number of errors occurs amongst the bits that a check is associated with.

Therefore, in some scenarios, the pattern of errors may be such that a disproportionate number of the checks are satisfied even though many bit errors have occurred. These errors may be present in the received codeword (e.g., P), which may not be correctable based on a min-sum decoding algorithm, or any of the other decoding algorithms that can be employed by conventional LDPC decoders 114. For example, conventional LDPC decoders 114 may operate based on a separate syndrome computed from P, and may generally determine whether a bit needs correction based on whether a majority of its checks have failed. Thus, when a disproportionate number of satisfied checks are computed when many errors have occurred, errors in the received codeword may remain uncorrected in the tentative codeword, and LDPC decoder 112 may rely on absorb set decoder 116 to correct these errors.

Absorb set error patterns are examples of such error patterns that may be present in the tentative codeword after correction by conventional LDPC decoders 114, and are error patterns that can be corrected by absorb set decoder 116. Absorb sets are described in detail below in connection with FIG. 3. Near absorb sets, which are similar in structure to absorb sets, are examples of correctable error patterns that may necessitate an impractical number of decoding iterations or an impractically high-precision, high-power-consuming min-sum decoder. Near absorb sets are described in detail below in connection with FIGS. 4 and 5. For simplicity, these figures will be described as if no errors other than those associated with an absorb set or near absorb set have occurred in a received codeword. However, it should be understood that the embodiments of the present invention are not limited to operating in this particular scenario.

Figure 3:
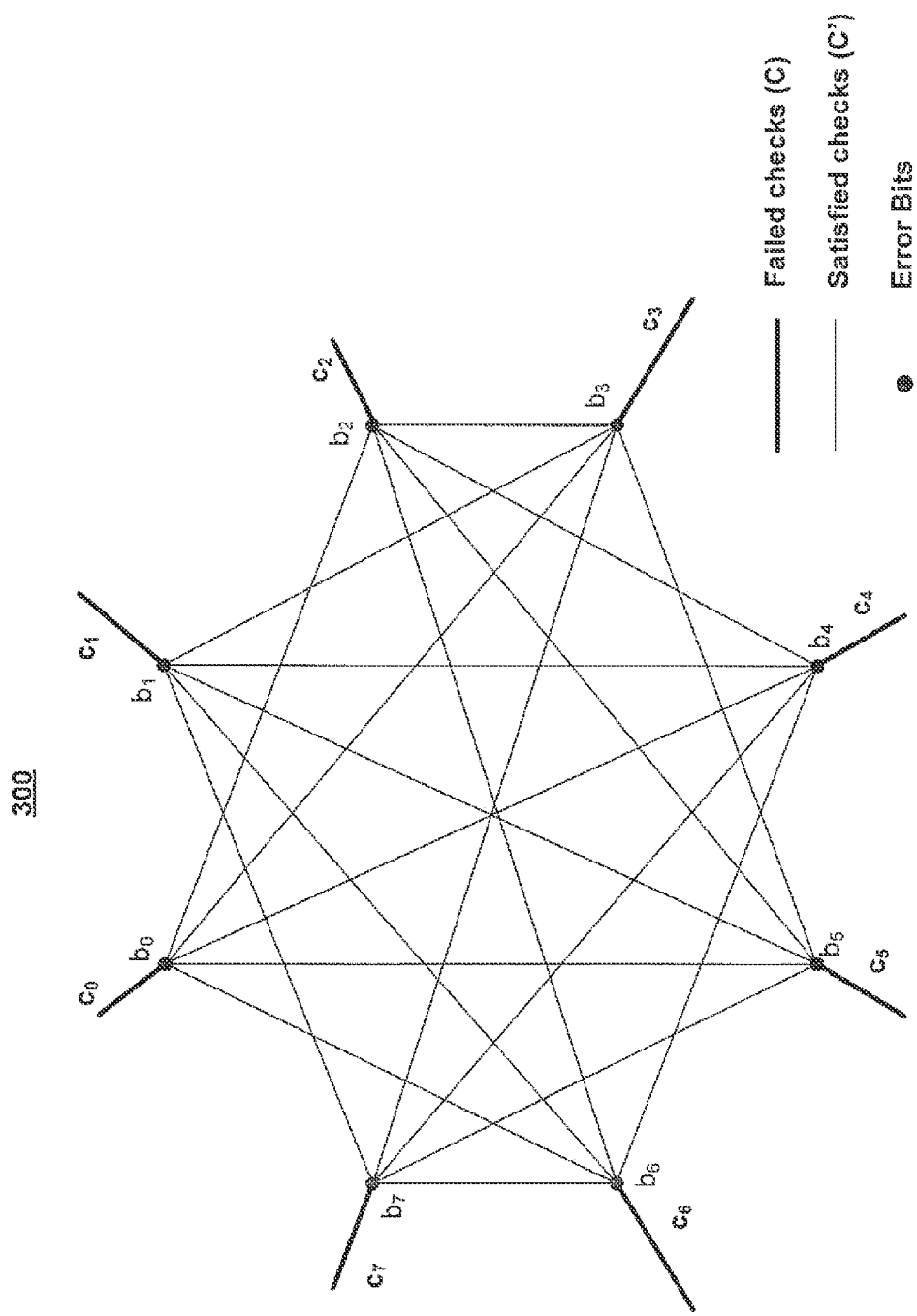
FIG. 3 shows a graphical representation of an absorb set.

An absorb set for the (2048, 1723) LDPC code refers to a set of eight incorrect bits in a tentative codeword, referred to collectively as B, that are positioned in such a way that each bit is checked by only one failed check. FIG. 3 shows a graphical representation of absorb set 300. The eight incorrect bits in absorb set 300 are illustrated as solid dots, and for clarity, are labeled as bits $b_0$ through $b_7$. As described above in connection with FIG. 2, each bit in a tentative codeword, including the eight bits in absorb set 300, are checked by six bits of its corresponding syndrome. All six checks associated with each of bits $b_0$ through $b_7$ are illustrated in FIG. 3 as a line. In particular, each line represents a check that connects to the bits in B that it checks. The failed checks are shown as thick lines, while the satisfied checks are shown as thinner lines. Because the checks are based on a modulo-2 summation of the bits it checks, all of the checks connecting two bits in B are satisfied even though they contain errors. The net effect is that each error bit is connected to five satisfied checks and only one failed check. Thus, an LDPC decoder employing min-sum decoding, or another standard decoding algorithm, would be difficult to detect the positions of these bit errors.

Moreover, absorb sets are difficult to correct because a received codeword affected by an absorb set is at an equal Hamming distance to four or more LDPC codewords. That is, absorb sets differ from four or more codewords in an equal number of bit positions. Thus, it may be difficult for typical LDPC decoding algorithms to distinguish the correct codeword from these four or more valid LDPC codewords.

Overall, absorb set 300 includes 20 satisfied and eight failed checks. The symbol, C, will hereinafter refer to the set of eight failed checks in an absorb set. Each failed check in C is associated with a different one of the bits in B. Thus, for clarity, in FIG. 3 as well as in FIGS. 4 and 5 described below, the failed check associated with bit $b_i$ in B will be labeled as check $c_i$ in C. The symbol, C' will hereinafter refer to the set of 20 satisfied checks in an absorb set.

Figure 4:
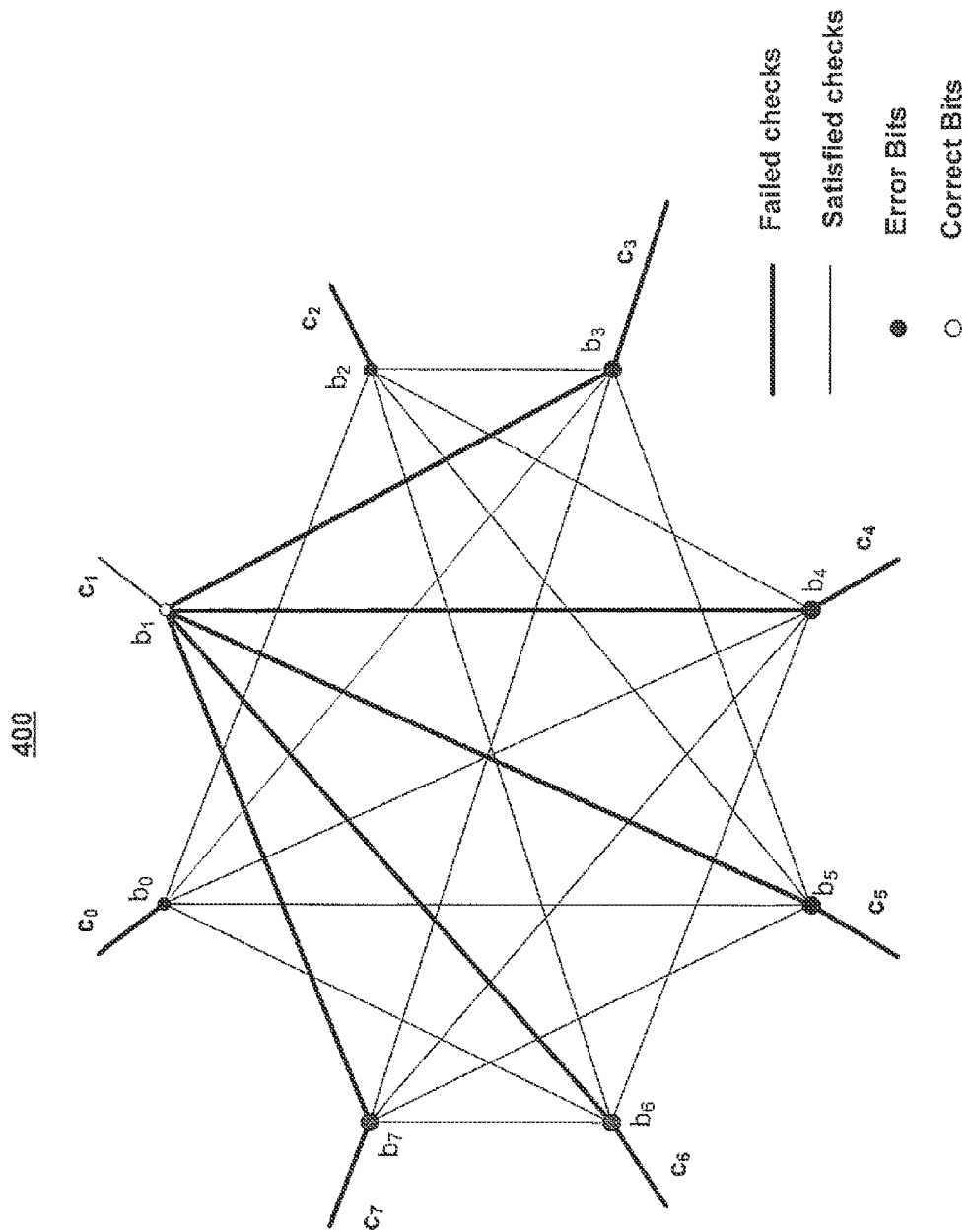
FIGS. 4 and 5 show graphical representations of near absorb sets.
Figure 5:
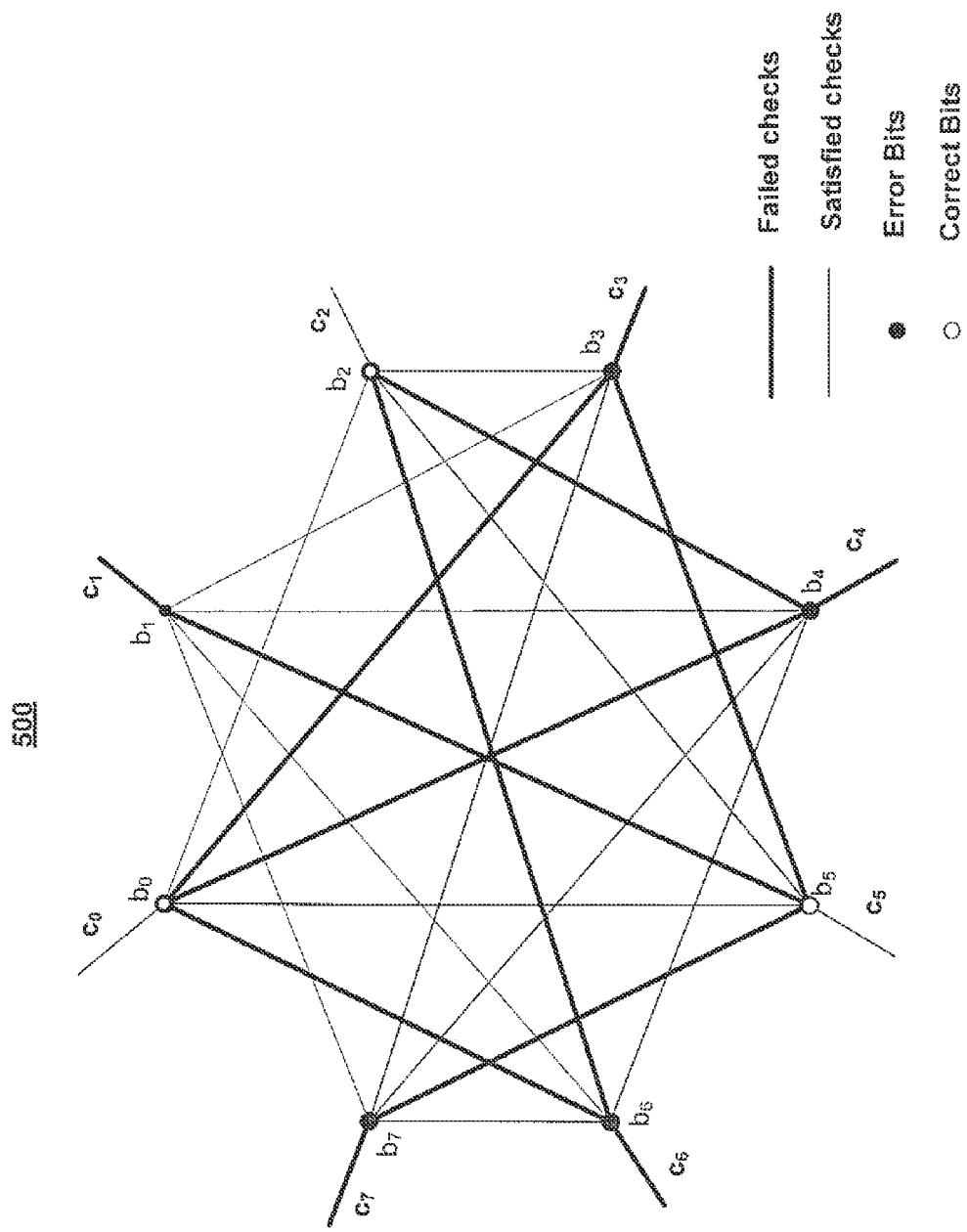

Near absorb sets are similar in structure to absorb sets, except one, two, or three bits of B are received correctly. FIGS. 4 and 5 show graphical representations of two illustrative near absorb sets, where near absorb set 400 of FIG. 4 has seven incorrect bits, and near absorb set 500 of FIG. 5 has five incorrect bits. In these figures, correct bits are illustrated by hollow dots, while the incorrect bits are again illustrated by solid dots. For simplicity, near absorb set 400 and near absorb set 500 will be described in terms of their differences from absorb set 300.

In FIG. 4, instead of having eight incorrect bits, one of the bits, $b_1$, is correct. By flipping the value of only $b_1$ (as compared to absorb set 300 of FIG. 3), each check computed based on the value of $b_1$ changes state. Therefore, the check in C associated with $b_1$ is now satisfied, and the bits connecting $b_1$ to other bits in B now fail. The bits that are connected to $b_1$, namely $b_3$, $b_4$, $b_5$, $b_6$, and $b_1$, are checked by one more failed check than its absorb set counterpart of FIG. 3. In particular, rather than being checked by one satisfied check and five failed checks, these bits are checked by two satisfied checks and three failed checks. The increase in information that suggests that these bits are incorrect may allow these bits to be corrected using standard methods, such as using an iterative min-sum decoder. Nevertheless, a majority of the checks for each bit in B still fail, and therefore the iterative decoder may need an unpractical number of iterations to detect and correct these errors.

FIG. 5 shows another example of a near absorb set.

Near absorb set 500 shows a graphical representation of a near absorb set with five incorrect bits in B: bits $b_1$, $b_3$, $b_4$, $b_6$, and $b_7$ are incorrect, while bits $b_0$, $b_2$, and $b_5$ are correct. Because of the modulo-2 computation used to obtain the checks, a check in C' fails when it is connected to one correct bit and one incorrect bit. The check connecting bit $b_1$ and $b_5$ is an example of this. Similarly, a check in C' is satisfied when it is connected to two correct bits, such as the satisfied check connecting $b_0$ and $b_5$, or connected to two incorrect bits, such as the satisfied check connecting bits $b_1$ and $b_4$. As a result, incorrect bits $b_1$ and $b_7$ are checked by four satisfied checks and one failed check, and incorrect bits $b_1$, $b_3$, and $b_6$ are checked by three satisfied checks and two failed checks. Thus, as in FIG. 4, the bit errors in near absorb set 500 of FIG. 5 may require an iterative decoder capable of an impractical number of iterations in order to correct these errors.

For 10 GBase-T communications systems employing a (2048, 1723) LDPC code, 14,272 error patterns may result in absorb sets. In these systems, without an absorb set decoder (e.g., absorb set decoder 116 of FIG. 1), absorb sets and near absorb sets, such as those illustrated in FIGS. 3-5, can form the error floor of the transmission system. That is, the bit error rate of the system may be set substantially by the presence of absorb sets and near absorb sets. It would therefore be desirable to lower the error floor by utilizing an absorb set decoder to correct absorb sets and near absorb sets. One approach for implementing the absorb set decoder would be to include a lookup table that stores the 14,272 error patterns, which can be directly indexed by the syndrome of a tentative codeword. However, this solution is impractical due to its large memory requirement, and therefore its large area requirement. Accordingly, embodiments of the present invention can include an absorb set decoder that utilizes properties of the LDPC code, both in detecting these error patterns and in compressing the lookup table, to correct absorb sets and near absorb sets in a practical manner.

Figure 6:
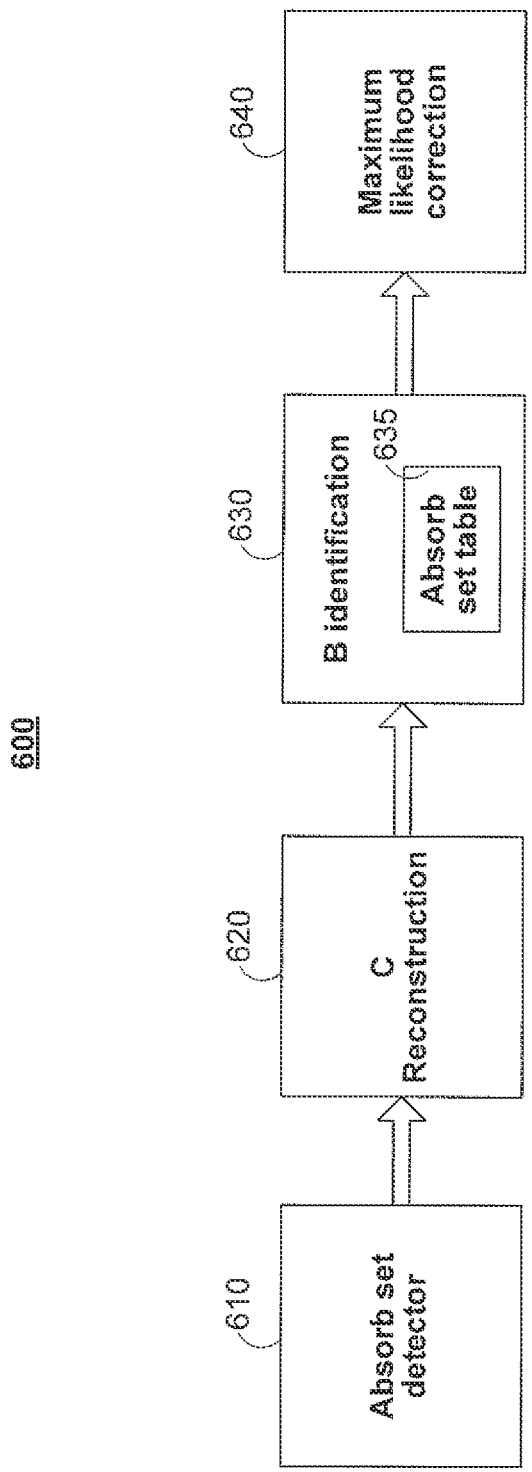
FIG. 6 shows a simplified block diagram of an illustrative absorb set decoder for decoding absorb sets and near absorb sets.

Referring now to FIG. 6, a simplified block diagram of absorb set decoder 600 is shown that can be configured to take advantage of the properties of the (2048, 1723) LDPC code. In some embodiments, absorb set decoder 600 may be a more detailed view of absorb set decoder 116 of FIG. 1. Absorb set decoder 600 can remove absorb sets and near absorb sets from a tentative codeword in order to obtain a corrected codeword. To accomplish this task, absorb set decoder 600 can include absorb set detector 610, C reconstruction unit 620, B identification unit 630, and maximum likelihood correction unit 640. Each of these components, which will be described in greater detail below, can be implemented using any suitable type of hardware, software, or firmware. For example, the functions described below may be performed by logic blocks implemented on an ASIC and for use in a 10 GBase-T receiver.

Absorb set detector 610 can detect the possible presence of an absorb set or a near absorb set. In particular, from the syndrome of the tentative codeword, absorb set detector 610 may identify five or more failed checks that potentially conform to the structures illustrated in FIGS. 3-5. The remaining components of absorb set decoder 600 may be configured to correct a tentative codeword when absorb set detector 610 determines that an absorb set or near absorb set may be present. Otherwise, the tentative codeword may be provided as the output of the overall LDPC encoder.

If a near absorb set is present, as opposed to an absorb set, some of the checks in C are satisfied checks. These satisfied checks are not easily identifiable in the 384-bit syndrome. In particular, absorb set decoder 600 cannot directly ascertain the locations of all the checks in C by simply examining the syndrome for eight failed checks. Accordingly, absorb set decoder 600 may include C reconstruction unit 620 for identifying the satisfied checks in C. This allows absorb set decoder 600 to correct not only absorb sets, but also near absorb sets. For example, if near absorb set 400 of FIG. 4 is present in the tentative codeword, C reconstruction unit 620 can identify which of the satisfied checks in the syndrome corresponds to $c_1$. Similarly, if near absorb set 500 of FIG. 5 is present in the tentative codeword, C reconstruction unit 620 can identify which of the satisfied checks in the syndrome correspond to $c_0$, $c_2$, and $c_5$. However, rather than providing all eight checks to B identification unit 630, C reconstruction unit 620 may first reduce C down to a smaller-sized, but full representation of the checks in C, and may provide this information to B identification unit 630. Part of the representation of C may be referred to as a reconstructed C subspace, and will be described in greater detail below in connection with C reconstruction unit 604 of FIG. 6.

B identification unit 630 may determine the possible error bit combinations, B, associated with the checks in C. For example, from checks $c_0, \ldots, c_7$ in FIGS. 3-5, B identification unit 630 may identify bits $b_0, \ldots, b_7$ in the absorb set that are associated with the checks. However, each check in C is associated with 32 bits, and therefore these checks may be associated with absorb set bit combinations other than the absorb set that is actually present in the tentative codeword. For the (2048, 1723) LDPC code, each set of checks, C, may be associated with 4, 8, 12, or 16 possible bit combinations that form absorb sets. At this stage in error correction, it is not clear which of these possible bit combinations should be used to correct the tentative codeword. Therefore, absorb set decoder 600 may include maximum likelihood correction unit 640 to correct the tentative codeword based on the bit combination that most likely occurred. That is, maximum likelihood correction unit 640 may compute the likelihood of each absorb set bit combination produced by B identification unit 630, and may flip the bits associated with the error bit combination with the greatest likelihood.

Referring again to B identification unit 630 of FIG. 6, B identification unit 630 may include absorb set table 635. Absorb set table 635 may be any suitable type of storage unit, such as a ROM or RAM, or any other volatile or nonvolatile storage device. For each reconstructed C subspace, absorb set table 635 can store at least one bit combination, B, associated with the checks. B identification unit 630 can use the at least one bit combination stored in absorb set table 635 for a particular C to derive the remaining possible combinations associated with that set C. For this and other reasons, absorb set table 635 does not need to store every possible bit combination, allowing absorb set table 635 to be reduced down to less than 1000 entries, or even less than 500 entries (e.g., 291 entries), for the (2048, 1723) LDPC code. This is a vast improvement over storing all 14,272 bit combinations that can cause absorb sets.

As mentioned above, the components of absorb set decoder 600 (FIG. 6) may be implemented in an advantageous way by utilizing the properties of the (2048, 1723) LDPC code. For clarity in describing the presentation, the basic structure of the (2048, 1723) code and related variables will be defined with reference to FIG. 7, which will be used throughout the description of some embodiments of the present invention.

Figure 7:
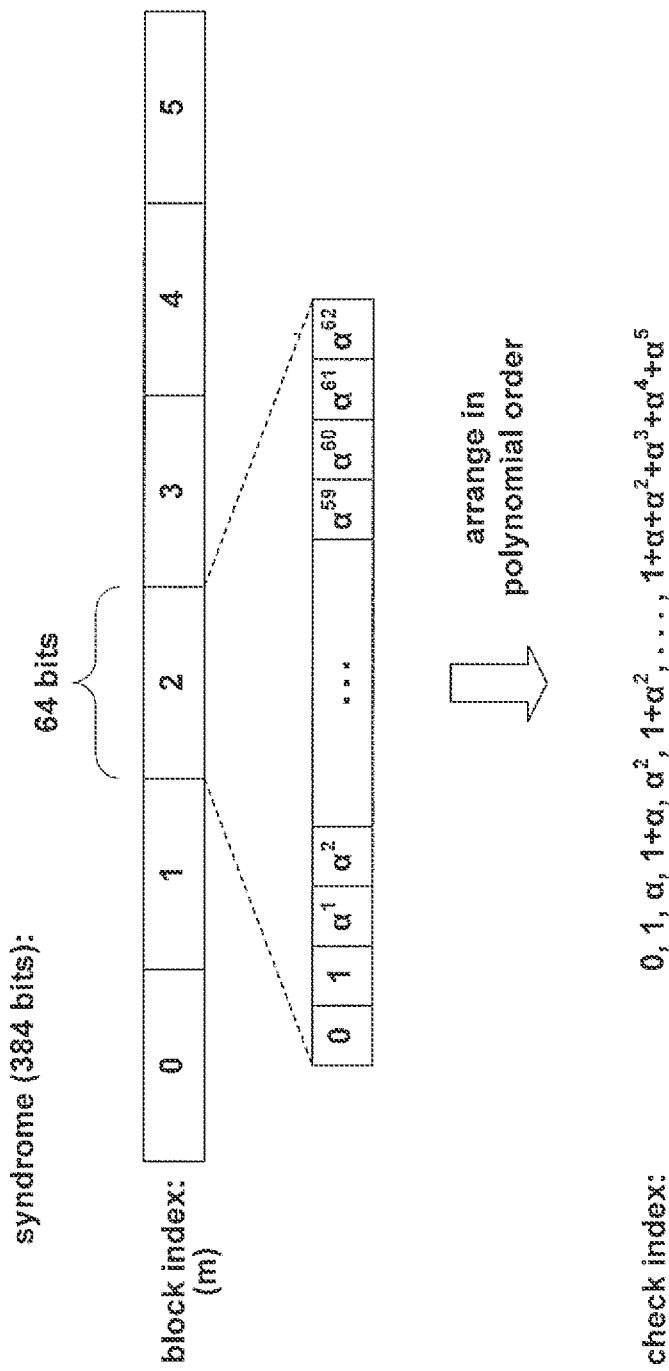
FIG. 7 illustrates the structure of a 384-bit syndrome based on a LDPC code and the polynomial ordering of check indices.

FIG. 7 illustrates the structure of a 384-bit syndrome corresponding to a tentative codeword. First, the 384-bit syndrome can be broken up into six distinct 64-bit blocks. These 64-bit syndrome blocks may be indexed by a "block index" that takes a value between zero and five. The block index may be referred by the variable, m. FIG. 7 also illustrates the structure of the checks within a 64-bit syndrome block. As shown for the third 64-bit block (e.g., the block with index 2), the 64 checks, which are ordered based on the parity check matrix for the (2048, 1723) LDPC code disclosed in the 10 Gbase-T standard, may each be associated with a distinct element of $GF(2^6)$ in an exponential order, e.g., $0, 1, \alpha^1, \ldots, \alpha^{62}$. Here, $\alpha$ is a primitive element in $GF(2^6)$ and satisfies the equation, $\alpha^6 + \alpha + 1 = 0$. To utilize the properties of the LDPC code, the checks of the 64-bit block may be rearranged such that their corresponding distinct elements are ordered according to a polynomial ordering, e.g., $0, 1, \alpha, 1+\alpha, \alpha^2, \ldots, 1+\alpha+\alpha^2+\alpha^3+\alpha^4+\alpha^5$, of elements for the same primitive element, $\alpha$. This alternate arrangement of checks may be achieved by rearranging the rows of the parity check matrix specified in the 10 GBase-T standard. Thus, embodiments of the LDPC decoders in the present invention may utilize a parity check matrix that arranges checks in polynomial order, and, unless otherwise stated, a "check index" will hereafter refer to an index to a check that is arranged according to polynomial order.

In addition to or instead of rearranging the rows of the parity check matrix specified in the standard, the columns of the parity check matrix may be rearranged. The columns of the matrix can be rearranged such that the resulting parity check matrix is composed of 192 matrices that are each of size 64×64, which may be referred to as permutation matrices. Each permutation matrix may have only one entry in each column equal to one and only one entry in each row equal to one. The resulting parity check matrix after column rearrangement can therefore produce an LDPC codeword where each of the 32 bits associated with a check can be in a different 64-bit block of the tentative codeword. This property will be illustrated and described in greater detail below in connection with equations (2) and (3) and FIG. 9. Thus, while the 10 Gbase-T standard provides a parity check matrix for the LDPC code in systematic form (e.g., where the information bits in the received codeword are contained in the first 1723 bits and the parity bits are contained in the last 325 bits), embodiments of the LDPC decoders in the present invention may decode the received and/or tentative codeword using an altered, non-systematic parity check matrix that is more suitable and convenient for decoding purposes.

Figure 8:
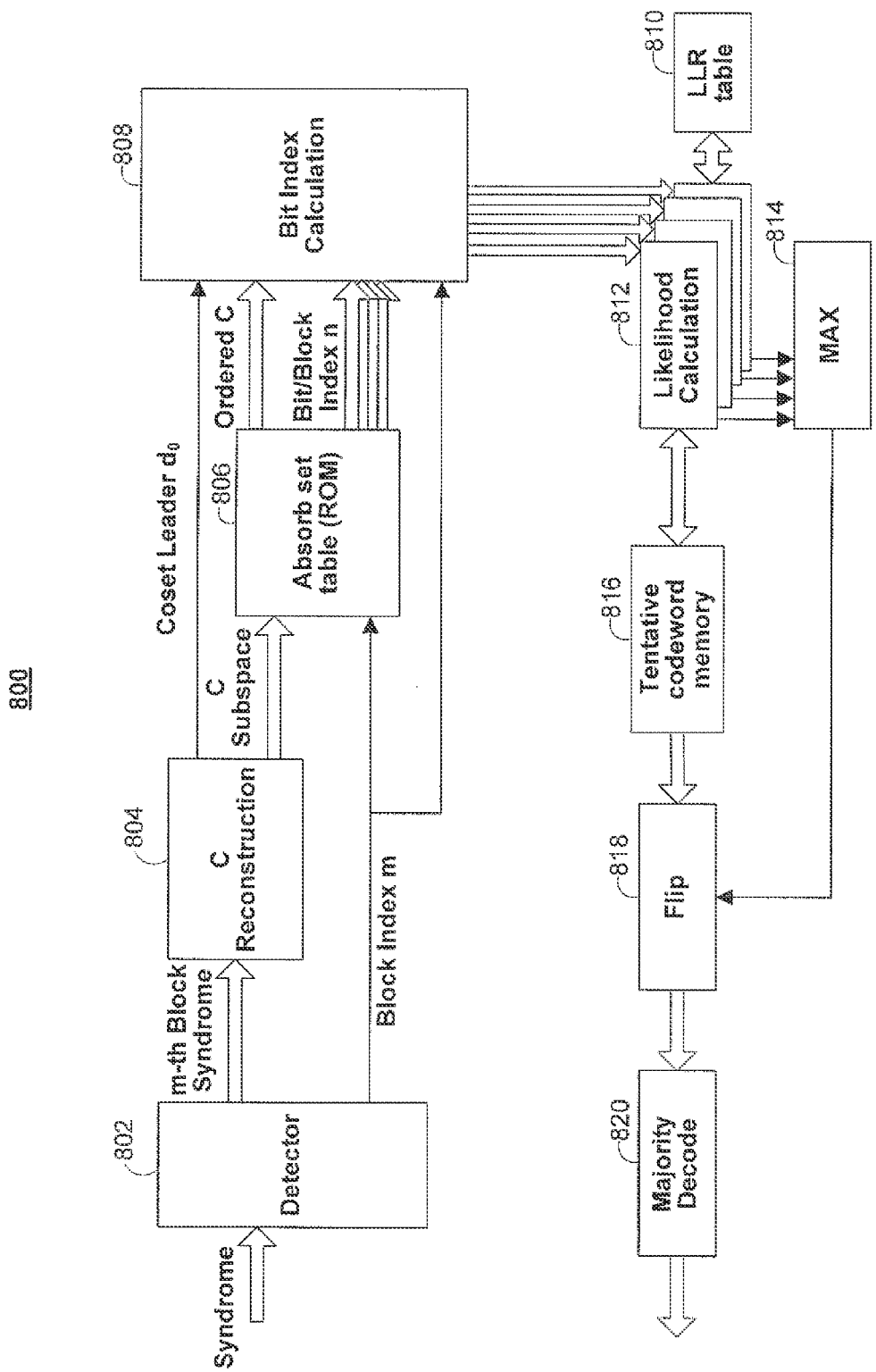
FIG. 8 shows a more detailed, yet still simplified, block diagram of the absorb set decoder in FIG. 6.

FIG. 8 shows a simplified block diagram of absorb set decoder 800 for detecting and correcting absorb sets and near absorb sets in accordance with an embodiment of the present invention. Absorb set decoder 800 may be a more detailed, yet still simplified, view of absorb set decoder 600 of FIG. 6. Absorb set decoder 800 may include detector 802, C reconstruction unit 804, absorb set table 806, bit index calculation unit 808, LLR table 810, likelihood calculation unit 812, maximizing unit 814, tentative codeword memory 816, flip unit 818, and majority decoder 820, each of which will be described in detail below. The implementations of some of these components enable them to take advantage of various properties of the LDPC code. These properties will also be described in connection with FIG. 8.

Absorb set decoder 800 can operate on a tentative codeword obtained from a conventional LDPC decoder (e.g., conventional LDPC decoders 114 of FIG. 1). The conventional LDPC decoder may be capable of correcting errors that do not have the absorb set or near absorb set structure illustrated in FIG. 3, and is used to correct a codeword when the codeword is initially received. This conventional LDPC decoder may compute the syndrome of the received codeword and/or the tentative codeword for its own use in correcting non-absorb sets. Using the syndrome computed by the conventional LDPC decoder, absorb set decoder 800, and more particularly detector 802, can detect the possible presence of absorb sets or near absorb sets.

Detector 802 may have any of the features or functionalities of absorb set detector 610 (FIG. 6). In particular, detector 802 can determine whether an absorb set or a near absorb set may be present in the tentative codeword based on the 384-bit syndrome. To perform this task, detector 802 may count the number of failed checks in each 64-bit block of the syndrome, and may decide that an absorb set or near absorb set is possibly present based on whether there is one (and only one) block that includes between five and eight failed checks, inclusive, that correspond to the failed checks in B (FIGS. 3-5). Detector 802 can operate in this manner because of the following two properties of the (2048, 1723) LDPC code.

First, due to the structure of the LDPC code, all of the checks in C for an absorb or near absorb set are located within one of the six 64-bit blocks in the syndrome. For example, the eight checks $c_0, \ldots, c_7$ in absorb set 300 (FIG. 3) are all located within the same 64-bit block of the syndrome (e.g., in the third block illustrated in FIG. 7). Thus, detecting eight failed checks within one of the blocks is a first indication that an absorb set may be present. Similarly, detecting five, six, or seven failed checks within one of the syndrome blocks is a first indication that a near absorb set may be present.

The second property of the (2048, 1723) LDPC code used by detector 802 (FIG. 8) in detecting absorb sets and near absorb sets relates to the location of the checks in C' within a syndrome. Each of the six checks associated with a particular bit in C' may be located in a different 64-bit block of the syndrome. Therefore, while one 64-bit block includes up to eight failed checks, none of the other five blocks may include more than four failed checks. For example, referring briefly back to FIG. 4, the five failed checks associated with correct bit $b_1$ may be located in different blocks, resulting in one block with seven failed checks and five blocks each with one failed check. Referring briefly back to FIG. 5, five incorrect bits are present, and therefore one block may include five failed checks. As for the other blocks, the three correct bits, $b_0$, $b_2$, and $b_5$, may each be associated with at most one failed check in a particular 64-bit block, for a total of at most three failed checks in any of these blocks. Thus, detecting no more than three errors in five of the 64-bit syndrome blocks is a second indication that an absorb set or a near absorb set is present.

Therefore, detector 802 can be configured to determine whether only one of the 64-bit syndrome blocks includes between five and eight failed checks, because this condition allows detector 802 to detect cases where one block can be associated with a near absorb set of at least five bit errors and to ensure that no other block has more than four bit errors. When detector 802 encounters a codeword that may have been affected by an absorb set error pattern, detector 802 may output the block index of the 64-bit syndrome block that includes the five or more failed checks. As described below, this block index may be used by both C reconstruction unit 804 and absorb set table 806 to identify possible error bit combinations.

C reconstruction unit 804 may have any of the features or functionalities of C reconstruction unit 620 described above in connection with FIG. 6. That is, C reconstruction unit 804 can use the failed checks in C (e.g., $C_1$, $C_3$, $C_4$, $C_5$, and $C_7$ of FIG. 5) obtained from the syndrome to derive information that fully represents all of the checks in C, including the satisfied checks in C (e.g., $C_0$, $C_2$, and $C_5$ in FIG. 5). C reconstruction unit 804 can obtain information covering the satisfied checks in C, because the check indices of C (when ordered in polynomial order) form a coset of a 3-dimensional subspace of a larger space on $GF(2^6)$. That is, the check indices in C may correspond to a 3-dimensional subspace (which includes a zero element) with a common shift that is added to each element of the 3-dimensional subspace. Therefore, only a subset of C is needed to define the subspace.

C reconstruction unit 804 can use a sufficient number of any of the failed checks in C to recover complete information of C. Table 1 shows a representation of each check index in C in terms of three variables that define the C subspace, and one more variable that defines the common shift of the subspace. In particular, the check indices are written in terms of the check index of one of the checks, referred to as the coset leader $d_0$, and a coefficient, $a_i$, for each dimension of the 3-dimensional subspace. The three coefficients may collectively be referred to as the "base" of the subspace.

TABLE 1

| $C(d_0)$ |
| --- |
| $d_0$ |
| $d_0 + a_1$ |
| $d_0 + a_2$ |
| $d_0 + a_1 + a_2$ |
| $d_0 + a_3$ |
| $d_0 + a_1 + a_3$ |
| $d_0 + a_2 + a_3$ |
| $d_0 + a_1 + a_2 + a_3$ |

As illustrated in Table 1, the eight check indices can be reduced down to four total variables including the coset leader. Therefore, C reconstruction unit 804 does not need the values of all of the checks in C to have complete information on C. In fact, C reconstruction unit 804 can select three indices that, taken together, can be used to solve for $a_1$, $a_2$, and $a_3$. For example, in some scenarios, C reconstruction unit 804 may select check indices $d_0+a_1$, $d_0+a_2$, and $d_0+a_1+a_2+a_3$ to represent the C subspace. The selected checks may be referred to as $d_1$, $d_2$, and $d_3$, respectively.

Note, however, that the coefficient $a_3$ is not present in an entry of Table 1 until the fifth entry, and therefore at least five checks need to be considered when selecting three checks to represent C. For example, if C reconstruction unit 804 uses only the first four check indices for the C recovery process, C reconstruction unit 804 would not be able to recover $a_3$, and would therefore not have full information on the check indices of the remaining checks. On the other hand, if C reconstruction unit 804 uses the first five check indices in the recovery process, C reconstruction unit 804 can identify three checks that represent C, as long as $d_0+a_3$ is one of the selected checks. Accordingly, using this technique, C reconstruction unit 804 may be capable of correcting absorb sets and absorb sets with at least five errors in B.

The checks in C have a symmetric property such that any of the checks in C can be used as the coset leader. Therefore, C reconstruction unit 804 is not restricted to operating on a particular set of failed checks in C to reconstruct C. For example, if the check index from the second entry of Table 1 is used as the coset leader, the resulting check indices would be those shown in Table 2.

TABLE 2

| C ($d_0 + a_1$) | | |
|---|---|---|
| $(d_0 + a_1)$ | = | $d_0 + a_1$ |
| $(d_0 + a_1) + a_1$ | = | $d_0$ |
| $(d_0 + a_1) + a_2$ | = | $d_0 + a_1 + a_2$ |
| $(d_0 + a_1) + a_1 + a_2$ | = | $d_0 + a_2$ |
| $(d_0 + a_1) + a_3$ | = | $d_0 + a_1 + a_3$ |
| $(d_0 + a_1) + a_1 + a_3$ | = | $d_0 + a_3$ |
| $(d_0 + a_1) + a_2 + a_3$ | = | $d_0 + a_1 + a_2 + a_3$ |
| $(d_0 + a_1) + a_1 + a_2 + a_3$ | = | $d_0 + a_2 + a_3$ |

The indices listed in Table 2 are the same as those in Table 1, but in a different order. That is, Table 2 includes the entries of Table 1, but shows a different permutation of the entries. Therefore, C reconstruction unit 804 can obtain any five failed checks in C from the syndrome to select checks $d_1$, $d_2$, and $d_3$.

Because any check can be the coset leader, C reconstruction unit 804 may remove the dependency of checks $d_1$, $d_2$, and $d_3$ on the check index, $d_0$, of the coset leader. For example, if $d_0+a_1$, $d_0+a_2$, and $d_0+a_1+a_2+a_3$ are the selected check indices, C reconstruction unit 804 may obtain $a_1$, $a_2$, and $a_1+a_2+a_3$. For simplicity, these values will be referred to by the variables, $d_1'$, $d_2'$, and $d_3'$. C reconstruction unit 804 may provide a reconstructed C subspace, which can be derived from the values of $d_1'$, $d_2'$, and $d_3'$. The reconstructed C subspace includes an ordered set of modified check indices, $C_0, \ldots, C_7$, that can be used to represent the checks in C. For example, Table 3 shows one embodiment of a reconstructed C subspace. In other embodiments, these checks may be ordered differently depending on the values of $d_1'$, $d_2'$, and $d_3'$.

TABLE 3

| index | C |
|---|---|
| $C_0$ | 0 |
| $C_1$ | $d_1'$ |
| $C_2$ | $d_2'$ |
| $C_3$ | $d_1' + d_2'$ |
| $C_4$ | $d_3'$ |
| $C_5$ | $d_1' + d_3'$ |
| $C_6$ | $d_2' + d_3'$ |
| $C_7$ | $d_1' + d_2' + d_3'$ |

The reconstructed C subspace of Table 3, together with the coset leader $d_0$, fully represents the checks in C, because all of the check indices in C may be recovered by adding (modulo-2) the check index of the coset leader to each entry of Table 3. That is, the check indices in C may be computed according to, $$\text{index}[c_j] = C_j \oplus d_0. \quad (1)$$

Thus, a reconstructed C subspace refers to information that partially represents all of the checks in C, and where all of the check indices can be recovered from the reconstructed C subspace using the check index of any one of the checks in C. The information that represents all of the checks in C may be in the form of modified check indices (e.g., the modified check indices in Table 3). A modified check index refers to a value in the reconstructed subspaace that can be used to recover one check index for a check in C.

Three modified check indices of Table 3 correspond to the base of the subspace (e.g., $a_1$, $a_2$, and $a_3$). Thus, C reconstruction unit 804 may locate the values of $a_1$, $a_2$, and $a_3$ from amongst the reconstructed C subspace, and may provide these values as the output. To obtain the base of the subspace, C reconstruction unit 804 can perform the steps shown in flow diagram 1200 in FIG. 12, described below. In addition to providing the base, C reconstruction unit 804 may also output the check index of a coset leader, thus enabling other components of absorb set decoder 800 to compute the check indices for all the checks in C (e.g., using equation (1)).

The reconstructed C subspace and check index of the coset leader may be used by absorb set table 806 and by bit index calculation unit 808 to obtain the possible absorb set bit combinations associated with the failed checks in C. Absorb set table 806 and bit index calculation unit 808 may collectively have any of the features and functionalities of B identification unit 630 of FIG. 6. In particular, absorb set table 806 may have any of the features and functionalities of absorb set table 635 (FIG. 6), and can be used to store, among other things, the bit combinations that form absorb sets and/or near absorb sets. From the bit combinations, bit index calculation unit 808 can identify the exact locations of the possible errors in the codeword.

Absorb set table 806 may be any suitable type of lookup table. The values stored in the lookup table may be predetermined, and therefore absorb set table 806 can be implemented using any suitable ROM-based storage device. Absorb set table 806 can be pre-stored with reconstructed C subspaces, such as the C subspace shown in Table 3. Thus, absorb set table 806 can be used to store particular values for modified check indices $C_0, \ldots, C_7$ for each valid combination of $a_1$, $a_2$, and $a_3$.

Figure 9:
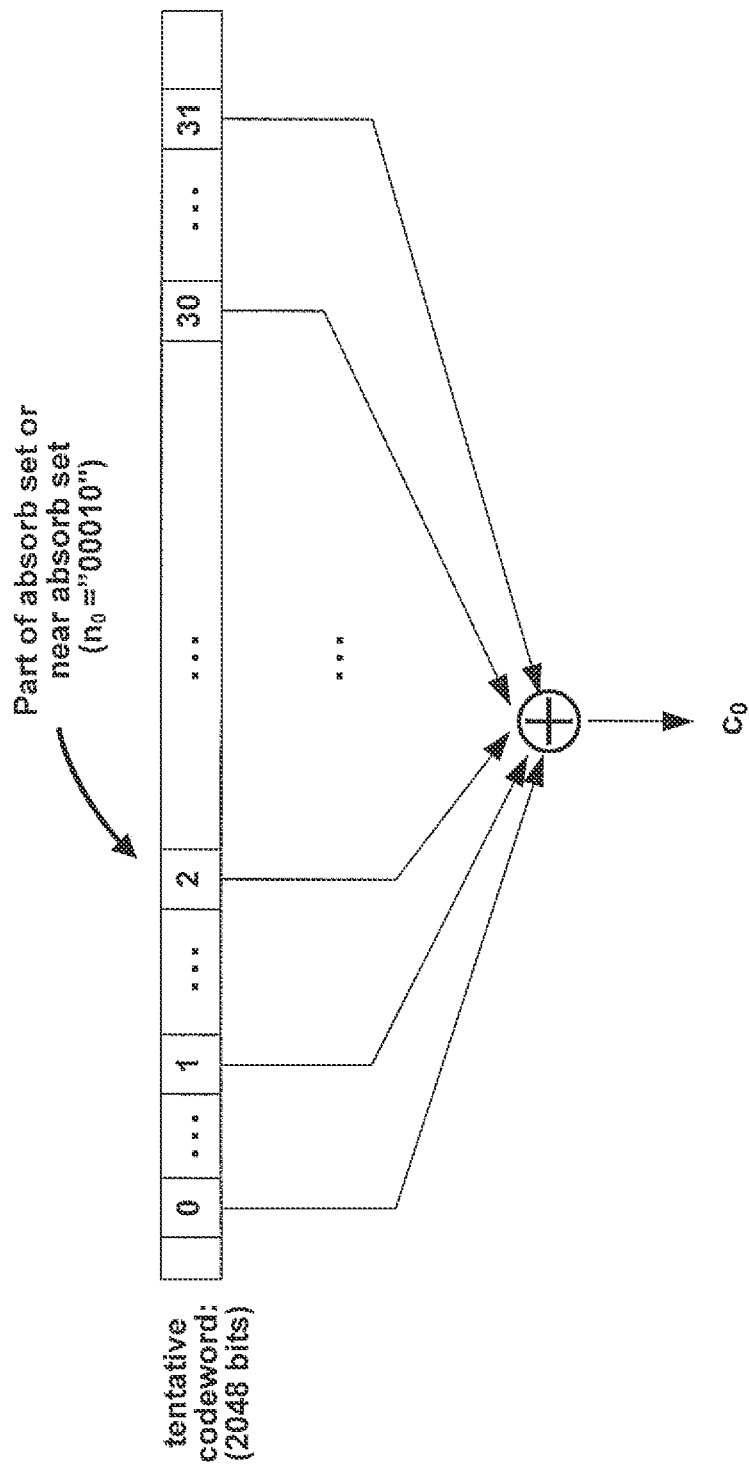
FIG. 9 shows a graphical representation of the 32 checked bit indices associated with a check.

Absorb set table 806 can also be used to store one or more bit combinations associated with a particular C. For example, referring back to FIG. 3, absorb set table 806 stores information that allows bits $b_0$, $b_7$ to be associated with checks $c_0, \ldots, c_7$. Absorb set table 806 can store this information in the form of a checked bit index, $n_i$, for each check $c_i$ in C. The checked bit index, $n_0$, for an illustrative check $c_0$, is illustrated in FIG. 9. In particular, FIG. 9 shows a graphical representation of a 2048-bit tentative codeword, of which 32 bits are used to compute a check, $c_0$. One of these 32 bits corresponds to bit $b_0$ in the absorb set. In the illustrated example of FIG. 9, the third bit (bit 2) that $c_0$ checks is the bit that is part of the absorb set. Thus, for this check, absorb set table 806 may store a checked bit index, $n_0$="00010" (two in binary), to associate checked bit 2 with $c_0$. Note that, as specified by the parity check matrix of the LDPC code, this third bit may be located in the third 64-bit of the tentative codeword. As further examples, a checked bit index of $n_1$="00000" for $c_1$ may refer to the first bit (bit 0) associated with check $c_1$, and a bit index of $n_2$="11111" may refer to the 32nd bit (bit 31) associated with check $c_2$. Absorb set table 806 may store up to four sets of checked bit indices for a given C.

Checked bit indices should not be confused with the bit indices computed by bit index calculation unit 808 (described below). A checked bit index is a five-bit index that indexes to one of the 32 bits associated with a check illustrated in FIG. 9, while a bit index computed by bit index calculation unit 808 indexes to a particular bit in the entire 2048-bit tentative codeword.

Referring again to FIG. 8, one entry of absorb set table 806 may, for example, store checked bit indices given by [5, 7, 8, 9, 10, 13, 17, 31]. This indicates that, for a given set of checks in C, the bits of the absorb set can be found on the fifth bit on the first check (check 0), the seventh bit on the second check (check 1), and the eight bit on the third check (check 2), etc. As mentioned above, absorb set table 806 can store up to four such entries for a given C.

Absorb set table 806 may be addressed by the block index, m, and the C subspace base coefficients, $a_1$, $a_2$, and $a_3$. In particular, absorb set table 806 may be organized into six sub-tables, where each sub-table is associated with a particular 64-bit syndrome block. Therefore, a particular sub-table may be selected based on the block index output of detector 802, from the sub-table, the base information provided by C reconstruction unit 804 can be used to select a reconstructed C subspace and its corresponding sets of checked bit indices. Thus, rather than addressing absorb set table 806 by the value of eight six-bit failed checks in C, absorb set table 806 can be addressed by only a three-bit block index and three six-bit base coefficients. Therefore, significant memory savings can be achieved compared to an uncompressed lookup table with 14,272 entries, as described above. This is one reason that the number of entries in absorb set table 806 can be reduced down to only, for example, 291 entries.

Bit index calculation unit 808 of FIG. 8 can convert the checked bit indices stored in absorb set table 806 to bit indices for a codeword. That is, from the checked bit indices, bit index calculation unit 808 may identify the actual locations of the error bits in the received codeword. To perform this conversion, bit index calculation unit 808 can include any suitable logic, circuitry, or software constructs to compute a bit index for a codeword given by, $$B_i = 64n_i + (\text{Base}_{n_i} * C_i \oplus + d_0 \text{ xor Shift}_{m,n_i}), \quad (2)$$

where $\text{Base}_n$ is the vector shown in FIG. 10, $\text{Shift}_{m,n}$ is the matrix shown in FIG. 10, $n_i$ is the checked bit index for check $C_i$, and m is the block index. The multiplication by 64 in the first term of equation (2) results from the property of the parity matrix of the LDPC code (described above). That is, this multiplication ensures that the ith bit index for a check is located within the ith 64-bit block of the tentative codeword. Also, in equation (2), the "+" operator refers to integer domain addition, and the multiplication of $\text{Base}_n * C$ is performed in the GF(64) domain.

As mentioned above, each coset obtained from a reconstructed C subspace can produce up to 16 bit combinations. These additional bit combinations can be produced by bit index calculation unit 808. In particular, because of the structure of the LDPC code, certain permutations of the checked bit indices are also absorb sets associated with C. For example, the set of checked bit indices shown above, or [5, 7, 8, 9, 10, 13, 17, 31], may be permuted to [7, 5, 9, 8, 13, 10, 31, 17]. This permuted set corresponds to another absorb set associated with C. In particular, the bit combination associated with the seventh bit on the first check (check 0), the fifth bit on the second check (check 3), the ninth bit on the third check (check 4), etc. may also be an absorb set with a structure similar to absorb set 300 of FIG. 3, with the same set of checks C.

To obtain a permutation, bit index calculation unit 808 can add, in modulo-2, each value in the reconstructed C subspace (e.g., the entries in Table 3) with the check index of a check in C. As described above in connection with equation (1), regardless of which check in C is chosen, this computation produces all of the check indices associated with C in a particular order. Thus, bit index calculation unit 808 can perform this calculation once for each check in C to obtain different check permutations. To obtain each check in C, bit index calculation unit can extend the bit index calculation of equation (2) from using only the index of the coset leader, or $d_0$, to also using other check indices (e.g., $C_j \oplus d_0$). Thus, bit index calculation unit 808 can include any logic, circuitry, or software constructs to calculate the ith bit index according to, $$B_{kj}[i] = 64n_{ki} + (\text{Base}_{n_{ki}} * (C_i \oplus C_j \oplus d_0) \text{ xor Shift}_{m,n_{ki}}) \quad (3)$$

where $0 \leq j \leq 7$, $0 \leq k \leq q$, and q is a variable representing the number of sets of checked bit indices stored in absorb set table 806 and associated with a reconstructed C subspace. Equation (3) reduces to equation (2) above for a particular set of checked bit indices and without considering permutations. In some scenarios, it may not be necessary to compute equation (3) for all eight values of j. For example, there may be only four distinct checked bit indices in $C_j$, and therefore only four of the eight values may be needed in the computation of equation (3) (e.g., $0 \leq j \leq 3$ when the distinct values correspond to the first four values).

If the check bit indices obtained from absorb set table 806 are distinct (e.g., [5, 7, 8, 9, 10, 13, 17, 31]), each computation will produce a distinct permutation, and therefore bit index calculation unit 808 can generate eight absorb sets using equation (3). If, for example, half of the checked bit indices are repetitions (e.g., [5, 5, 7, 7, 10, 10, 31, 31]), bit index calculation unit 808 can generate four absorb sets. Overall, 4, 8, 12, or 16 bit combinations can be generated by bit index calculation unit 808 from the one, two, three, or four sets of checked bit indices for a reconstructed C. Because bit index calculation unit 808 is able to generate additional absorb sets for a reconstructed C subspace, these additional absorb sets do not need to be stored in absorb set table 806. This advantageously allows for additional memory savings, and is another reason for why absorb set table 806 can be reduced down to, for example, 291 entries.

At the output of bit index calculation unit 808, the locations of all the bit combinations associated with the failed checks in C are known. From these bit combinations, absorb set decoder 800 can attempt to correct the received codeword using one of the bit combinations. The remaining units of absorb set decoder 800, e.g., LLR table 810, likelihood calculation unit 812, maximizing unit 814, tentative codeword memory 816, flip unit 818, and majority decoder 820, collectively embody maximum likelihood correction unit 640 of FIG. 6. These components may have any of the features and functionalities described above in connection with maximum likelihood correction unit 640. In particular, these components may correct the tentative codeword based on the most likely bit combination of those obtained from bit index calculation unit 808.

LLR table 810 may be a memory (e.g., RAM-based memory) that stores soft information corresponding to the received codeword. For example, LLR table 810 may store the data obtained from a demodulator or quantizer (e.g., demodulator/quantizer 110 of FIG. 1). LLR table 810 may include 2048 entries—one for each bit of the 2048-bit received codeword. The soft information for each bit i in the received codeword may be in the form of a log-likelihood ratio (LLR) computed according to, $$LLR_i = \frac{\Pr\{b_i = 0 \mid \text{received value}\}}{\Pr\{b_i = 1 \mid \text{received value}\}}, \quad (4)$$

where $b_i$ represents the actual value that was transmitted. Thus the LLR stored for a bit may be positive if the actual transmitted bit was more likely zero, and the LLR may be negative if the actual transmitted bit was more likely one. In some embodiments, LLR table 810 may store soft information that is proportional to the LLR values of equation (4).

Tentative codeword memory 816 can be a memory (e.g., RAM-based memory) that stores the current tentative codeword computed by the conventional LDPC decoder (e.g., conventional LDPC decoders 114 of FIG. 1). Tentative codeword memory 816 may include 2048 storage spaces to store the 2048 bit estimates of the transmitted information. Each bit stored in tentative codeword memory 816 may correspond to an LLR stored in LLR table 810. Thus, by comparing the LLR and the bit estimate at each of the eight positions specified by a bit combination produced by bit index calculation unit 808, likelihood calculation units 812 can compute the likelihood of that bit combination.

Likelihood calculation units 812 can compute likelihoods for each bit combination generated by bit index calculation unit 808, where the likelihood is indicative of whether the errors of that bit combination are present in the tentative codeword. Absorb set decoder 800 may include multiple likelihood calculation units 812 for computing the likelihood for different bit combinations in parallel (e.g., four or 16 units), or can be configured to perform the computations serially or partially concurrently. Each likelihood calculation unit 812 may compute the likelihood of a bit combination according to, $$Likelihood_{kj} = \sum_{i=0}^{7} P[B_{kj}[i]] \cdot (2b[B_{kj}[i]] - 1), \quad (5)$$

where P[i] is the received log-likelihood ratio for bit i obtained from LLR table 810, and b[i] is the current tentative codeword at that same bit position obtained from tentative codeword memory 816. Essentially, equation (5) is a summation of the likelihoods of each individual bit being flipped in a current bit combination. Note that a negative likelihood signifies that the bits of the current bit combination are not likely to have been flipped, and that the magnitude of equation (5) indicates the strength of the likelihood.

An example of the operation of likelihood computation unit 812 will now be described in connection with Table 4.

TABLE 4

|  | 0 | 1 | 2 | 3 |
|---|---|---|---|---|
| Received codeword LLR (P) | 5 | 10 | −15 | 1 |
| Current codeword (b) | 0 | 0 | 1 | 1 |
| Bit combination 1 (B) |  | X | X |  |
| Bit combination 2 (B) | X |  |  | X |

Table 4 shows an example of four bits of a received codeword and a current tentative codeword. The received codeword may correspond to soft information obtained from, for example, demodulator/quantizer 110 of FIG. 1. The bit indices associated with the first bit combination obtained from bit index calculation unit 808 may specify that bits 1 and 2 are incorrect. Thus, if these bit errors actually occurred, bits 1 and 2 (along with others) would have flipped during transmission from a "1" to a "−1" and from a "−1" to a "1," respectively. The bit indices associated with the second bit combination obtained from bit index calculation unit 808 may specify that bits 0 and 3 (along with others) are incorrect. Based on equation (5) for only two incorrect bits, the likelihood of the first scenario is (10)*(−1)+(−15)*(1)=−25, while the likelihood of the second scenario is (5)*(−1)+(1)*(1)=−4.

The first scenario corresponds to a negative number of considerably greater magnitude, and therefore an absorb set with the first bit combination likely is less likely to be present in the current tentative codeword. Thus, given the current tentative codeword, absorb set decoder 800 can conclude that the second scenario is more likely to be present in the tentative codeword than the first.

With continuing reference to FIG. 8, maximizing unit 814 may determine which of the likelihoods computed by likelihood computation unit 812 is the greatest. Thus, maximizing unit 814 can include any suitable comparator implementation for obtaining, $$k, j = \arg\max Likelihood_{kj}. \quad (6)$$

For example, using equation (6), maximizing unit 814 may determine that the second bit combination illustrated in Table 4 is more likely than the first bit combination. Based on the result of the comparison, flip unit 818 can flip the bits associated with the most likely bit combination. That is, flip unit 818 may compute, $$b[B_{kj}[i]] = !b[B_{kj}[i]], \quad (7)$$

where flip unit 818 changes a "1" in the current tentative codeword to a "0" or a "0" in the current tentative codeword to a "1" for each bit specified by the most likely bit combination. Thus, flip unit 818 may flip eight bits in the current tentative codeword to provide a corrected codeword with a possible absorb set error pattern removed from the tentative codeword. If a near absorb set is present in the current tentative codeword, flip unit 818 may correct the five to seven bits that were incorrect, but may also flip the one to three bits that were originally correct. Thus, absorb set decoder 800 can include majority decoder 820 to recover the bits that were originally correct, and to correct any other remaining incorrect bits that were not part of the eight absorb set bits.

Majority decoder 820 may then decode the recovered codeword using a single iteration of a majority logic decoding algorithm to obtain a final recovered codeword. This final recovered codeword may or might not be a valid codeword depending on whether an absorb set or near absorb set was actually present in the received codeword, and depending on whether absorb set decoder 800 was able to correct an existing absorb set or near absorb set. When the result is a valid codeword, proper absorb set correction is assumed, and the valid codeword may be provided as the output of absorb set decoder 800 and the overall LDPC decoder (e.g., LDPC decoder 112 of FIG. 1). Otherwise, the result produced by majority decoder 820 may be disregarded, and the result of the conventional LDPC decoder (e.g., conventional LDPC decoders 114 of FIG. 1) may be used. For example, absorb set decoder 800 (or majority decoder 820) may transmit a correction failure signal to the corresponding conventional LDPC decoder (e.g., conventional LDPC decoders 114 of FIG. 1), and the conventional LDPC decoder may provide its output as the overall output of the LDPC decoder. Alternatively, absorb set decoder 800 can transmit the tentative codeword (e.g., from tentative codeword memory 816) as the overall output.

Figure 11:
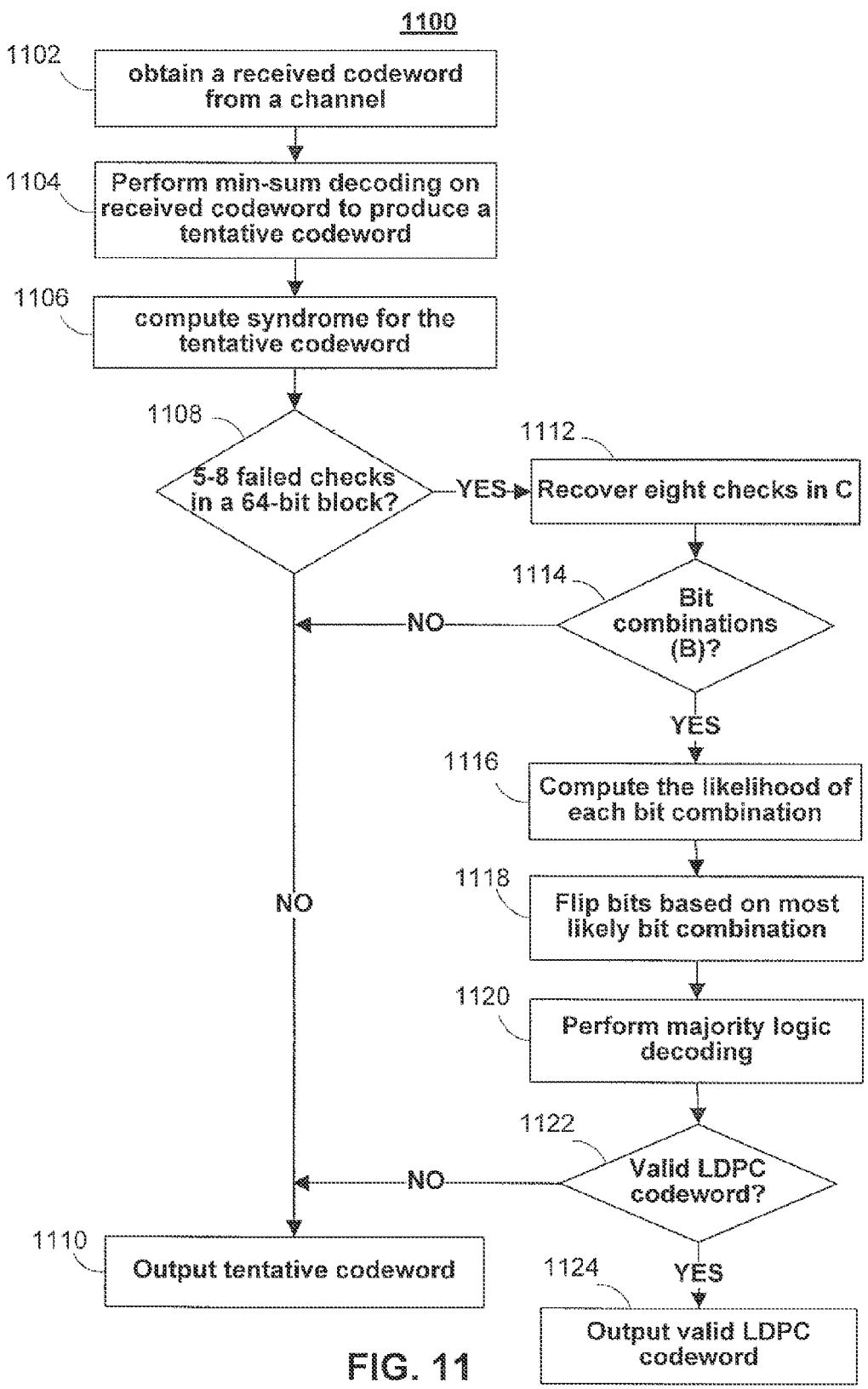
FIG. 11 shows an illustrative flow diagram for correcting absorb sets and near absorb sets.
Figure 12:
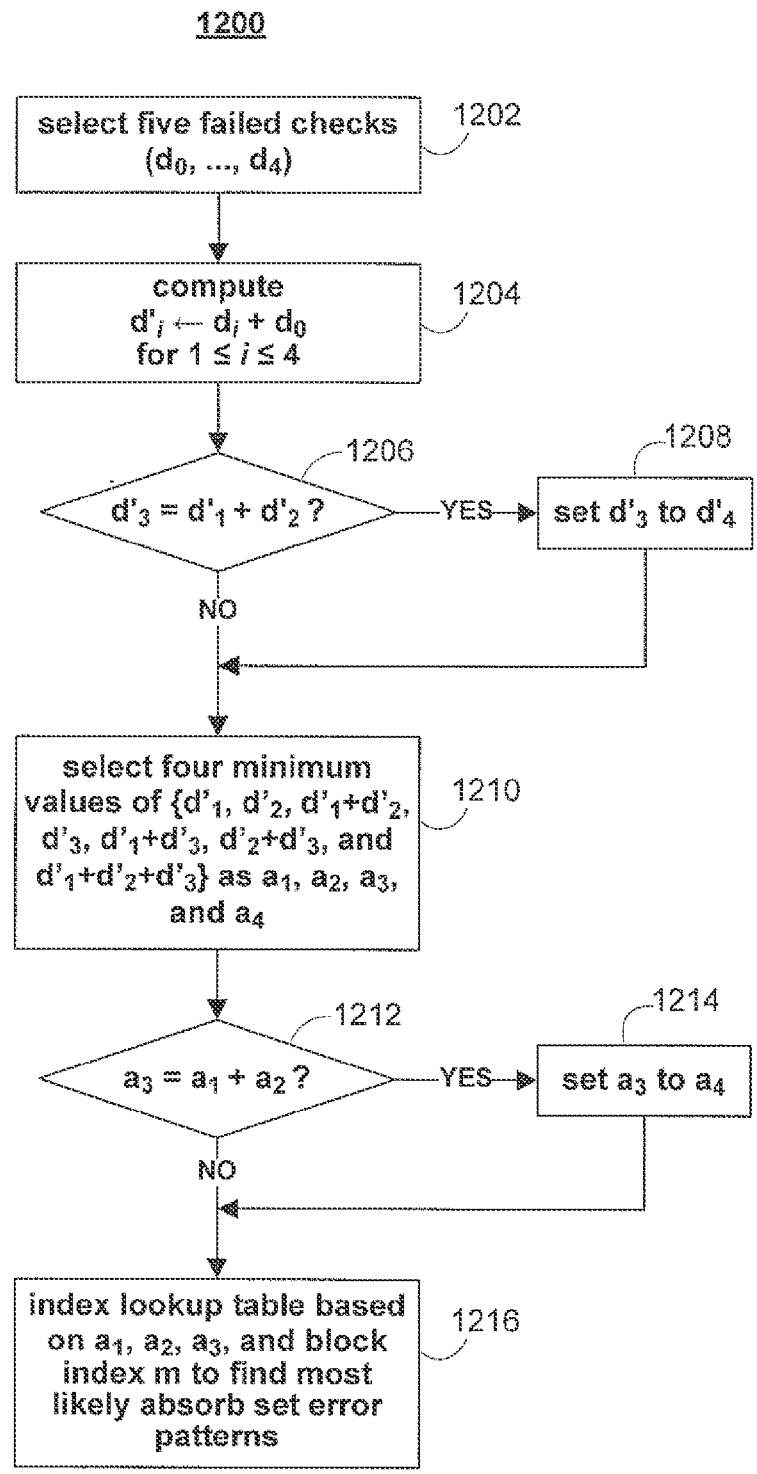
FIG. 12 shows an illustrative flow diagram for reconstructing a C subspace.

Referring now to FIGS. 11 and 12, illustrative flow diagrams are shown for correcting absorb sets and near absorb sets. It should be understood that these flow diagrams are merely illustrative. In particular, any steps may be added to these flow diagrams, or any steps may be removed or modified, without departing from the scope of the present invention.

Referring first to FIG. 11, illustrative flow diagram 1100 is shown for correcting an absorb set or near absorb set from a received or a tentative codeword in accordance with an embodiment of the present invention. A decoder, such as LDPC decoder 112 of FIG. 1, can perform the steps of flow diagram 1100. At step 1102, the decoder may receive a codeword derived from a channel (e.g., channel 108 of FIG. 1), and can perform min-sum decoding or another suitable LDPC decoding algorithm on the received codeword at step 1104. The received codeword may correspond to soft information (e.g., LLRs) or hard information, which the decoder can use to produce a tentative codeword. At step 1106, the decoder may compute a syndrome for the tentative codeword. The syndrome may or might not include failed checks that indicate the possible presence of an absorb set or a near absorb set. At step 1108, in order to detect the presence of an absorb set or near absorb set, the decoder may determine whether there exists one block that includes five, six, seven, or eight failed checks. If not, no absorb set or near absorb set may be present. Therefore, at step 1110, the detector may output the tentative codeword as the result of LDPC decoding.

Returning to step 1108, if the decoder determines that one 64-bit block includes five, six, seven, or eight failed checks, an absorb set or near absorb set may have affected the received codeword. When this occurs, the flow of flow diagram 1100 may move to step 1112. At this step, the decoder may obtain information that is representative of all of the checks in C, whether satisfied or failed. In particular, the decoder may use any five of the failed checks in C obtained from the syndrome to recover the other checks in C. The recovered information may be in the form of a reconstructed C subspace, such as the subspace illustrated in Table 3, and a coset leader. Then, at step 1114, the decoder may attempt to identify the bit combinations, B, that can produce the combination of checks in C. The decoder may attempt to identify bit combinations by performing a table lookup into a lookup table to obtain at least one of the bit combinations. If decoder is able to identify bit combinations (e.g., if the table lookup is successful), the flow of flow diagram 1100 may continue to step 1116. Otherwise, at step 1110, the decoder may output the tentative codeword as the result of LDPC decoding.

When the decoder is able to identify bit combinations, there may be 4, 8, 12, or 16 such bit combinations for any given C. At step 1116, the decoder may compute the likelihood of each of these bit combinations. That is, for each bit combination, the decoder may determine the likelihood that the bit combination is present in the tentative codeword. Then, at step 1118, the decoder may flip the bits in the tentative codeword that correspond to the most likely bit combination, and at step 1120, may perform majority logic decoding on the resulting codeword. The result of majority logic decoding may or might not be a recovered codeword that is valid in the LDPC code domain. Thus, at step 1122, the decoder may determine whether the recovered codeword is truly a codeword. If it is not a codeword, the decoder may disregard the result and may output the tentative codeword at step 1110. If the result is a valid codeword in the LDPC code domain, the decoder can output this valid LDPC codeword as the result of LDPC decoding at step 1124.

FIG. 12 shows illustrative flow diagram 1200 for obtaining a reconstructed C subspace from the failed checks in a syndrome and for obtaining the base of the subspace. The steps of flow diagram 1200 may by performed a C reconstruction unit, such as C reconstruction unit 604 of FIG. 6 or C reconstruction unit 804 of FIG. 8.

At step 1202, five unique failed checks are selected from within a 64-bit syndrome block. The 64-bit block may include other failed checks (e.g., up to eight failed checks), and any five of these failed checks may be selected at step 1202. The check indices of these five failed checks may be referred to by the variables $d_0$, $d_1$, $d_2$, $d_3$, and $d_4$. The check associated with check index $d_0$ may be dubbed the coset leader, and any of the selected failed checks may be assigned as the coset leader. As shown in Table 1 (described above in connection with FIG. 6), the remaining check indices can be specified in terms of $d_0$. To remove this dependency on $d_0$, at step 1204, the check indices of $d_1$ through $d_4$ may be added to $d_0$ in modulo-2 to produce new variables, $d_1'$ though $d_4'$.

Then, at step 1206, a determination can be made as to whether $d_3'$ is equal to the modulo-2 sum of $d_2'$ and $d_1'$. If it is equal, the value of $d_3'$ may be replaced by the value of $d_4'$ at step 1208. These steps ensure that $d_1'$, $d_2'$, and $d_3'$ are linearly independent, and therefore include sufficient information to represent the 3-dimensional reconstructed C subspace. If, at step 1206, it is determined that $d_1'$, $d_2'$, and $d_3'$ are linearly independent without alteration to $d_3'$, the original value of $d_3'$ can be maintained, and the process illustrated by flow diagram 1200 moves to step 1210.

The remaining steps of flow diagram 1200 can be performed to obtain the base of the LDPC code—that is, to obtain values for $a_1$, $a_2$, and $a_3$ described above. At step 1210, the four minimum values of the set, $$\{d_1', d_2', d_1' \oplus d_2', d_3', d_1' \oplus d_3', d_2' \oplus d_3', d_1' \oplus d_2' \oplus d_3'\}$$

may be initially selected as $a_1$, $a_2$, $a_3$, and $a_4$. The seven values in this set, and the zero value, form the reconstructed C subspace. Because the reconstructed C subspace is 3-dimensional, only three values are needed to represent the subspace. However, for similar reasons as those described above, at step 1210, four values are initially selected to ensure that the final three selected values are linearly independent. In particular, if it is discovered at step 1212 that the first three values, $a_1$, $a_2$, and $a_3$, only form a 2-dimensional subspace, $a_3$ may be replaced by $a4$ at step 1214. At the conclusion of step 1214, the base (e.g., $a_1$, $a_2$, and $a_3$) of the C subspace has been identified. This base may be used to index into a lookup table (e.g., absorb set table 606 of FIG. 6) to determine the bit combinations associated with the reconstructed C subspace. Thus, at step 1216, the values of $a_1$, $a_2$, and $a_3$, as well as a block index m, may be used to index into a lookup table to find the absorb set error patterns that may have affected the received signal.

Referring now to FIGS. 13-19, various exemplary implementations of the present invention are shown.

Figure 13:
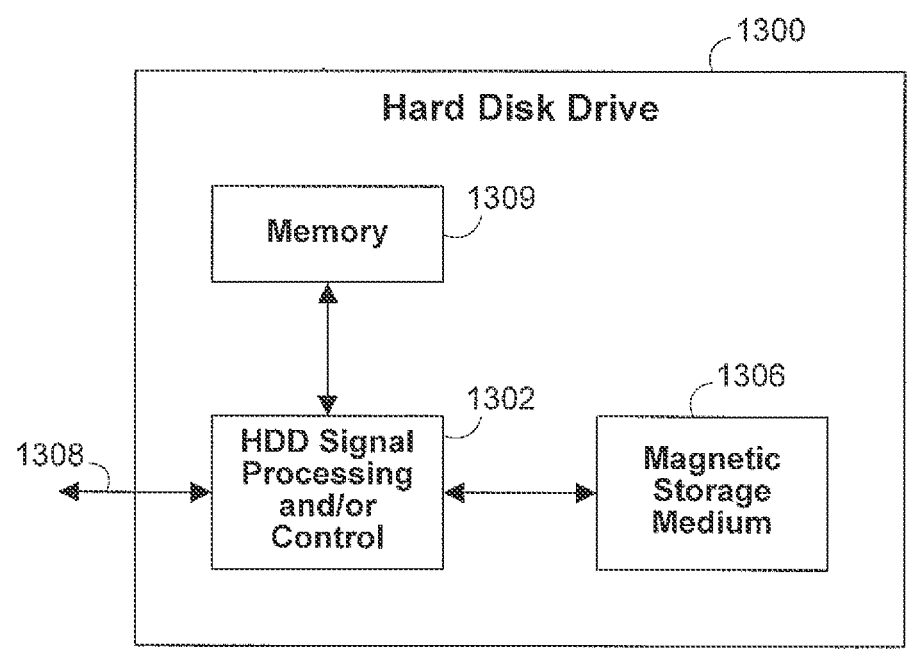
FIG. 13 is a block diagram of an exemplary hard disk drive that can employ the disclosed technology.

Referring now to FIG. 13, the present invention can be implemented in a hard disk drive 1300. The present invention may be implemented in either or both signal processing and/or control circuits, which are generally identified in FIG. 13 at 1302. In some implementations, the signal processing and/or control circuit 1302 and/or other circuits (not shown) in the HDD 1300 may process data, perform coding and/or encryption, perform calculations, and/or format data that is output to and/or received from a magnetic storage medium 1306.

The HDD 1300 may communicate with a host device (not shown) such as a computer, mobile computing devices such as personal digital assistants, cellular phones, media or MP3 players and the like, and/or other devices via one or more wired or wireless communication links 1308. The HDD 1300 may be connected to memory 1309 such as random access memory (RAM), nonvolatile memory such as flash memory, read only memory (ROM) and/or other suitable electronic data storage.

Figure 14:
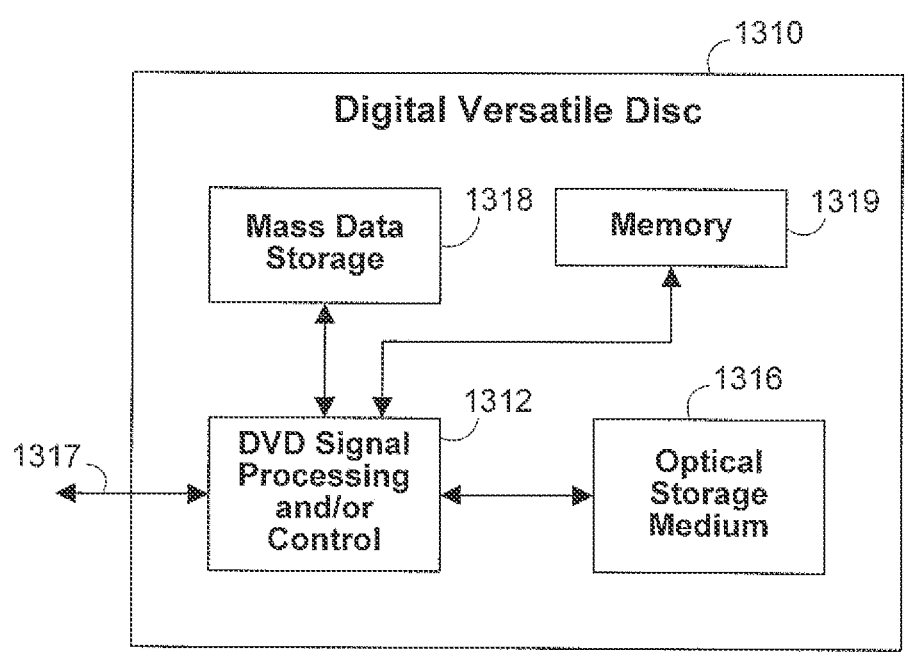
FIG. 14 is a block diagram of an exemplary digital versatile disc that can employ the disclosed technology.

Referring now to FIG. 14, the present invention can be implemented in a digital versatile disc (DVD) drive 1310. The present invention may be implemented in either or both signal processing and/or control circuits, which are generally identified in FIG. 14 at 1312, and/or mass data storage 1318 of the DVD drive 1310. The signal processing and/or control circuit 1312 and/or other circuits (not shown) in the DVD drive 1310 may process data, perform coding and/or encryption, perform calculations, and/or format data that is read from and/or data written to an optical storage medium 1316. In some implementations, the signal processing and/or control circuit 1312 and/or other circuits (not shown) in the DVD drive 1310 can also perform other functions such as encoding and/or decoding and/or any other signal processing functions associated with a DVD drive.

The DVD drive 1310 may communicate with an output device (not shown) such as a computer, television or other device via one or more wired or wireless communication links 1317. The DVD drive 1310 may communicate with mass data storage 1318 that stores data in a nonvolatile manner. The mass data storage 1318 may include a hard disk drive (HDD). The HDD may have the configuration shown in FIG. 13. The HDD may be a mini HDD that includes one or more platters having a diameter that is smaller than approximately 1.8". The DVD drive 1310 may be connected to memory 1319 such as RAM, ROM, nonvolatile memory such as flash memory and/or other suitable electronic data storage.

Figure 15:
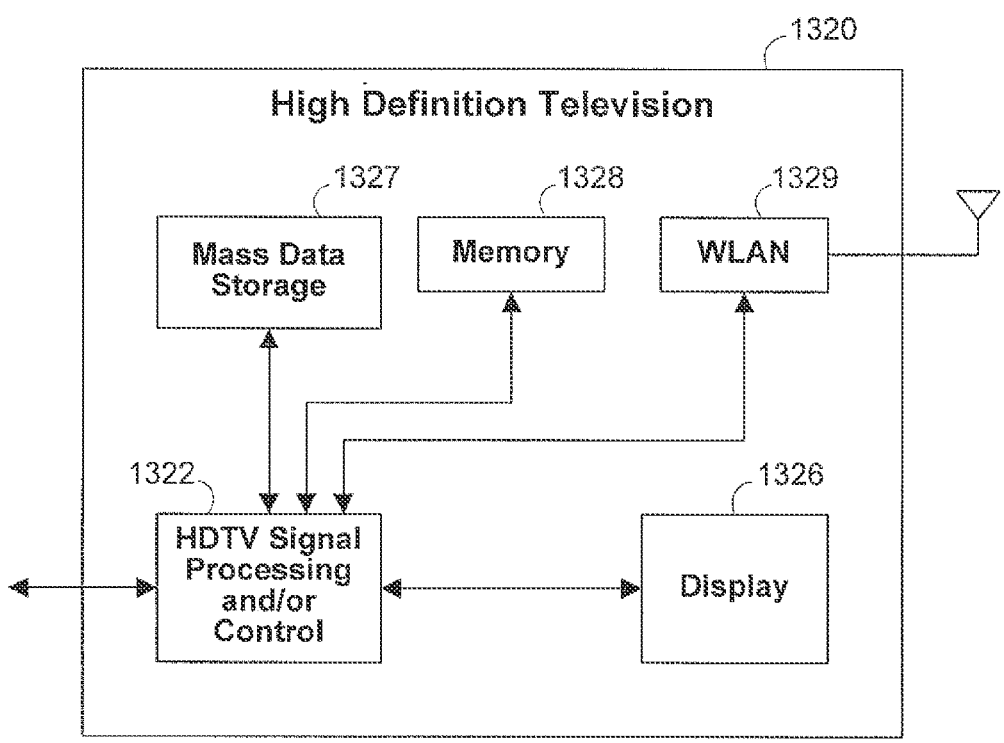
FIG. 15 is a block diagram of an exemplary high definition television that can employ the disclosed technology.

Referring now to FIG. 15, the present invention can be implemented in a high definition television (HDTV) 1320.

The present invention may be implemented in either or both signal processing and/or control circuits, which are generally identified in FIG. 15 at 1322, a WLAN interface 1329 and/or mass data storage 1327 of the HDTV 1320. The HDTV 1320 receives HDTV input signals in either a wired or wireless format and generates HDTV output signals for a display 1326. In some implementations, signal processing circuit and/or control circuit 1322 and/or other circuits (not shown) of the HDTV 1320 may process data, perform coding and/or encryption, perform calculations, format data and/or perform any other type of HDTV processing that may be required.

The HDTV 1320 may communicate with mass data storage 1327 that stores data in a nonvolatile manner such as optical and/or magnetic storage devices for example hard disk drives HDD and/or DVDs. At least one HDD may have the configuration shown in FIG. 13 and/or at least one DVD may have the configuration shown in FIG. 14. The HDD may be a mini HDD that includes one or more platters having a diameter that is smaller than approximately 1.8". The HDTV 1320 may be connected to memory 1328 such as RAM, ROM, nonvolatile memory such as flash memory and/or other suitable electronic data storage. The HDTV 1320 also may support connections with a WLAN via a WLAN network interface 1329.

Figure 16:
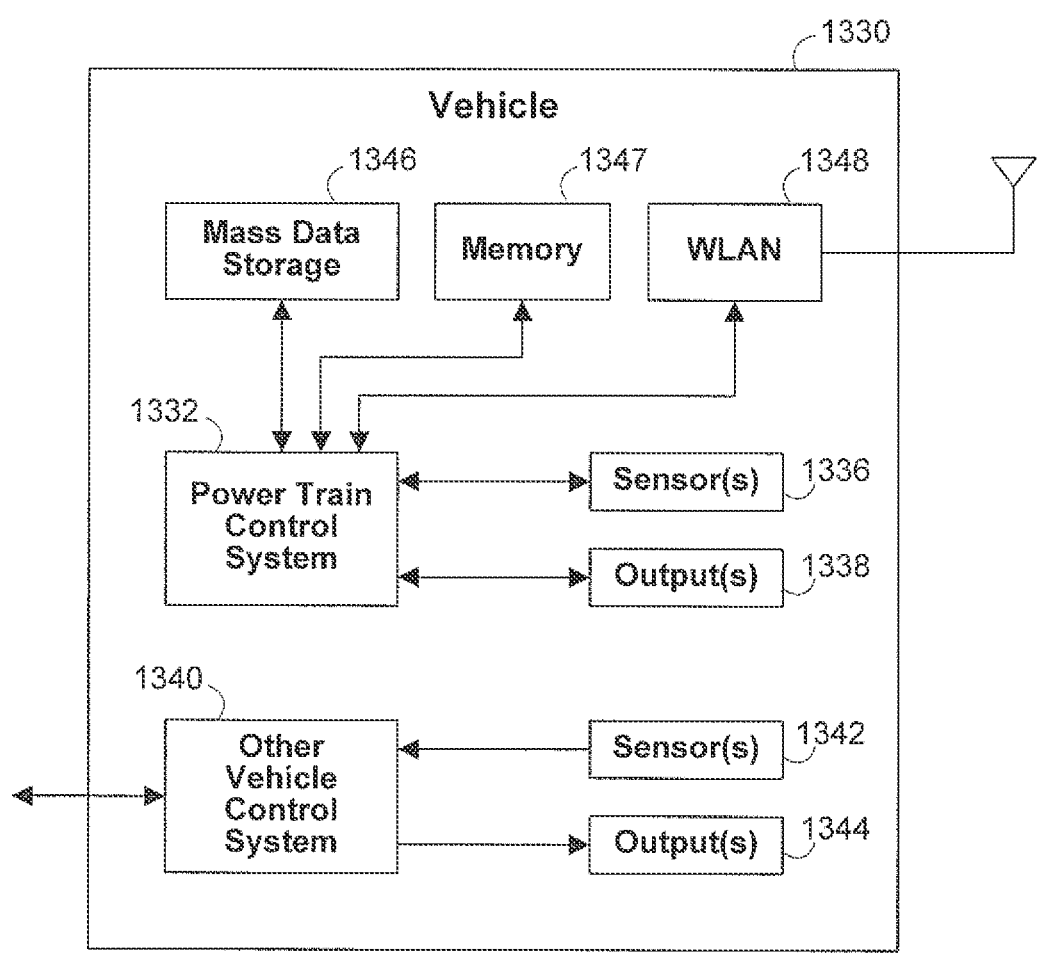
FIG. 16 is a block diagram of an exemplary vehicle that can employ the disclosed technology.

Referring now to FIG. 16, the present invention implements a control system of a vehicle 1330, a WLAN interface 1348 and/or mass data storage 1346 of the vehicle control system. In some implementations, the present invention may be implemented in a powertrain control system 1332 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 1340 of the vehicle 1330. The control system 1340 may likewise receive signals from input sensors 1342 and/or output control signals to one or more output devices 1344. In some implementations, the control system 1340 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1332 may communicate with mass data storage 1346 that stores data in a nonvolatile manner. The mass data storage 1346 may include optical and/or magnetic storage devices for example hard disk drives HDD and/or DVDs. At least one HDD may have the configuration shown in FIG. 13 and/or at least one DVD may have the configuration shown in FIG. 14. The HDD may be a mini HDD that includes one or more platters having a diameter that is smaller than approximately 1.8". The powertrain control system 1332 may be connected to memory 1347 such as RAM, ROM, nonvolatile memory such as flash memory and/or other suitable electronic data storage. The powertrain control system 1332 also may support connections with a WLAN via a WLAN network interface 1348. The control system 1340 may also include mass data storage, memory and/or a WLAN interface (all not shown).

Figure 17:
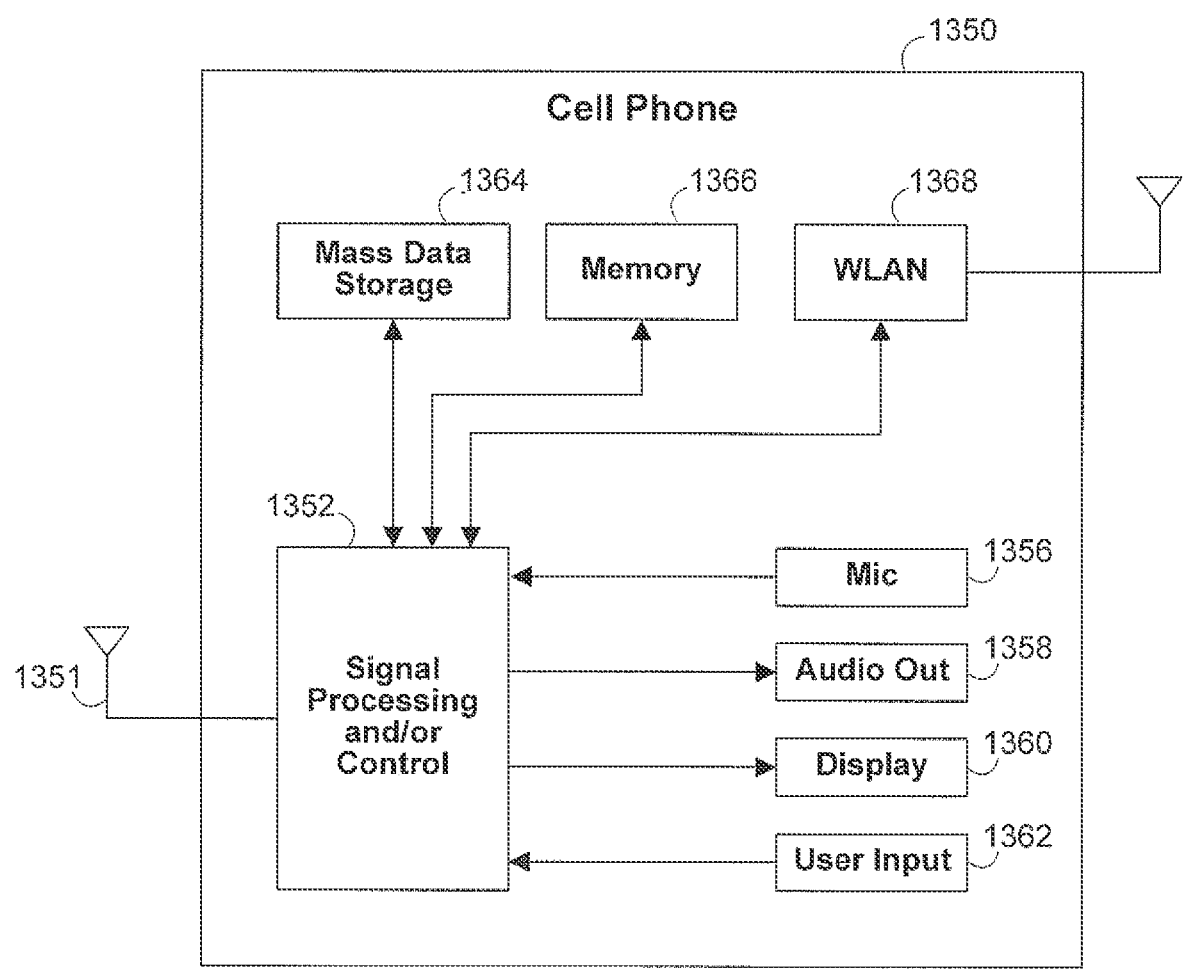
FIG. 17 is a block diagram of an exemplary cell phone that can employ the disclosed technology.

Referring now to FIG. 17, the present invention can be implemented in a cellular phone 1350 that may include a cellular antenna 1351. The present invention may be implemented in either or both signal processing and/or control circuits, which are generally identified in FIG. 17 at 1352, a WLAN interface 1368 and/or mass data storage 1364 of the cellular phone 1350. In some implementations, the cellular phone 1350 includes a microphone 1356, an audio output 1358 such as a speaker and/or audio output jack, a display 1360 and/or an input device 1362 such as a keypad, pointing device, voice actuation and/or other input device. The signal processing and/or control circuits 1352 and/or other circuits (not shown) in the cellular phone 1350 may process data, perform coding and/or encryption, perform calculations, format data and/or perform other cellular phone functions.

The cellular phone 1350 may communicate with mass data storage 1364 that stores data in a nonvolatile manner such as optical and/or magnetic storage devices for example hard disk drives HDD and/or DVDs. At least one HDD may have the configuration shown in FIG. 13 and/or at least one DVD may have the configuration shown in FIG. 14. The HDD may be a mini HDD that includes one or more platters having a diameter that is smaller than approximately 1.8". The cellular phone 1350 may be connected to memory 1366 such as RAM, ROM, nonvolatile memory such as flash memory and/or other suitable electronic data storage. The cellular phone 1350 also may support connections with a WLAN via a WLAN network interface 1368.

Figure 18:
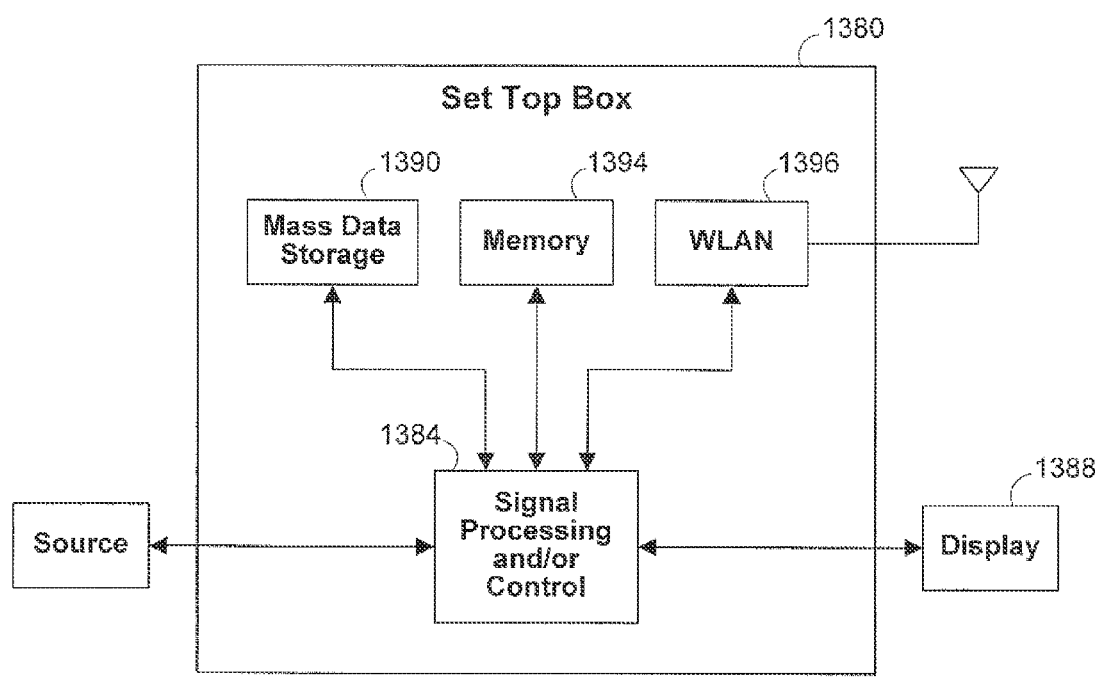
FIG. 18 is a block diagram of an exemplary set top box that can employ the disclosed technology.

Referring now to FIG. 18, the present invention can be implemented in a set top box 1380. The present invention may be implemented in either or both signal processing and/or control circuits, which are generally identified in FIG. 18 at 1384, a WLAN interface 1396 and/or mass data storage 1390 of the set top box 1380. The set top box 1380 receives signals from a source such as a broadband source and outputs standard and/or high definition audio/video signals suitable for a display 1388 such as a television and/or monitor and/or other video and/or audio output devices. The signal processing and/or control circuits 1384 and/or other circuits (not shown) of the set top box 1380 may process data, perform coding and/or encryption, perform calculations, format data and/or perform any other set top box function.

The set top box 1380 may communicate with mass data storage 1390 that stores data in a nonvolatile manner. The mass data storage 1390 may include optical and/or magnetic storage devices for example hard disk drives HDD and/or DVDs. At least one HDD may have the configuration shown in FIG. 13 and/or at least one DVD may have the configuration shown in FIG. 14. The HDD may be a mini HDD that includes one or more platters having a diameter that is smaller than approximately 1.8". The set top box 1380 may be connected to memory 1394 such as RAM, ROM, nonvolatile memory such as flash memory and/or other suitable electronic data storage. The set top box 1380 also may support connections with a WLAN via a WLAN network interface 1396.

Figure 19:
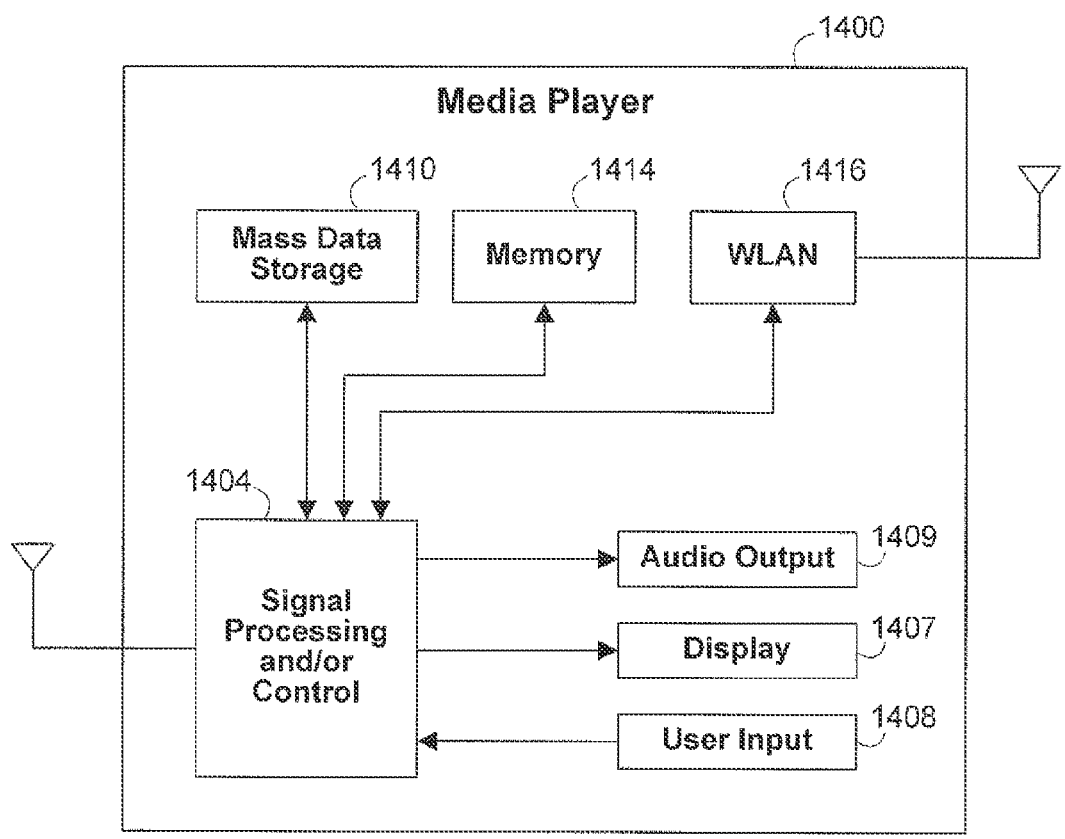
FIG. 19 is a block diagram of an exemplary media player that can employ the disclosed technology.

Referring now to FIG. 19, the present invention can be implemented in a media player 1400. The present invention may be implemented in either or both signal processing and/or control circuits, which are generally identified in FIG. 19 at 1404, a WLAN interface 1416 and/or mass data storage 1410 of the media player 1400. In some implementations, the media player 1400 includes a display 1407 and/or a user input 1408 such as a keypad, touchpad and the like. In some implementations, the media player 1400 may employ a graphical user interface (GUI) that typically employs menus, drop down menus, icons and/or a point-and-click interface via the display 1407 and/or user input 1408. The media player 1400 further includes an audio output 1409 such as a speaker and/or audio output jack. The signal processing and/or control circuits 1404 and/or other circuits (not shown) of the media player 1400 may process data, perform coding and/or encryption, perform calculations, format data and/or perform any other media player function.

The media player 1400 may communicate with mass data storage 1410 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 13 and/or at least one DVD may have the configuration shown in FIG. 14. The HDD may be a mini HDD that includes one or more platters having a diameter that is smaller than approximately 1.8". The media player 1400 may be connected to memory 1414 such as RAM, ROM, nonvolatile memory such as flash memory and/or other suitable electronic data storage. The media player 1400 also may support connections with a WLAN via a WLAN network interface 1416. Still other implementations in addition to those described above are contemplated.

The foregoing describes systems and methods for decoding absorb sets and near absorb sets in an LDPC decoder. Those skilled in the art will appreciate that the invention can be practiced by other than the described embodiments, which are presented for the purpose of illustration rather than of limitation.

What is claimed is:

1. A method of decoding a codeword, the method comprising:
    processing a received codeword using an LDPC decoder to produce a syndrome of a tentative codeword, the syndrome comprising a set of original check symbol values;
    modifying the set of original check symbol values to produce a set of modified check symbol values in response to a determination that an absorb set or a near absorb set is associated with the set of original check symbol values;
    determining a plurality of bit combinations, wherein each bit combination in the plurality is capable of producing the set of modified check symbol values;
    selecting a bit combination from the plurality of bit combinations; and
    modifying symbols in the tentative codeword based on the selected bit combination to produce a decoded codeword.

2. The method of claim 1, wherein the LDPC decoder employs a min-sum decoding process to produce the tentative codeword.

3. The method of claim 1, wherein the determination that the absorb set or the near absorb set is associated with the set of original check symbol values comprises determining that a block of the set of original check symbol values includes five, six, seven, or eight unsatisfied check symbols.

4. The method of claim 1, wherein selecting the bit combination from the plurality of bit combinations comprises:
    determining, for each bit combination in the plurality of bit combinations, a corresponding likelihood that the bit combination is present in the tentative codeword; and
    selecting the bit combination from the plurality of bit combinations that has the largest corresponding likelihood.

5. The method of claim 1, wherein modifying symbols in the tentative codeword based on the selected bit combination comprises flipping bits in the tentative codeword that correspond to the selected bit combination to produce the decoded codeword.

6. The method of claim 1, further comprising:
    outputting the tentative codeword in place of the decoded codeword in response to a determination that the decoded codeword is not a valid codeword in the LDPC code domain.

7. The method of claim 1, wherein a decoding failure is declared in response to a determination that neither an absorb set nor a near absorb set is associated with the set of original check symbol values.

8. The method of claim 1, wherein producing the set of modified check symbol values comprises:
    determining locations of unsatisfied check symbols in the set of original check symbol values; and
    selecting the set of modified check symbol values, at least in part, by accessing a portion of data in a lookup table based on the determined locations of the unsatisfied check symbols.

9. The method of claim 8, wherein the lookup table comprises:
    a section value indexing a plurality of subtables of the lookup table; and
    a coefficient value indexing dimensions of a three-dimensional subspace.

10. The method of claim 9, wherein the lookup table further comprises data representations corresponding to the plurality of bit combinations, wherein each bit combination in the plurality is capable of producing the set of modified check symbol values.

11. Decoding circuitry comprising:
   LDPC processing circuitry configured to process a received codeword to produce a syndrome of a tentative codeword, the syndrome comprising a set of original check symbol values; and
   absorb set decoding circuitry configured to:
      modify the set of original check symbol values to produce a set of modified check symbol values in response to a determination that an absorb set or a near absorb set is associated with the set of original check symbol values;
      determine a plurality of bit combinations, wherein each bit combination in the plurality is capable of producing the set of modified check symbol values;
      select a bit combination from the plurality of bit combinations; and
      modify symbols in the tentative codeword based on the selected bit combination to produce a decoded codeword.

12. The decoding circuitry of claim 11, wherein the LDPC processing circuitry further configured to employ a min-sum decoding process to produce the tentative codeword.

13. The decoding circuitry of claim 11, wherein the absorb set decoding circuitry is further configured to determine whether the absorb set or the near absorb set is associated with the set of original check symbol values by determining whether a block of the set of original check symbol values includes five, six, seven, or eight unsatisfied check symbols.

14. The decoding circuitry of claim 11, wherein the absorb set decoding circuitry is further configured to select the bit combination from the plurality of bit combinations by:
   determining, for each bit combination in the plurality of bit combinations, a corresponding likelihood that the bit combination is present in the tentative codeword; and
   selecting the bit combination from the plurality of bit combinations that has the largest corresponding likelihood.

15. The decoding circuitry of claim 11, wherein the absorb set decoding circuitry is further configured to modify symbols in the tentative codeword based on the selected bit combination by flipping bits in the tentative codeword that correspond to the selected bit combination to produce the decoded codeword.

16. The decoding circuitry of claim 11, wherein the absorb set decoding circuitry is further configured to output the tentative codeword in place of the decoded codeword in response to a determination that the decoded codeword is not a valid codeword in the LDPC code domain.

17. The decoding circuitry of claim 11, wherein the absorb set decoding circuitry is further configured to declare a decoding failure in response to a determination that neither an absorb set nor a near absorb set is associated with the set of original check symbol values.

18. The decoding circuitry of claim 11, wherein the absorb set decoding circuitry is further configured to produce the set of modified check symbol values by:
   determining locations of unsatisfied check symbols in the set of original check symbol values; and
   selecting the set of modified check symbol values, at least in part, by accessing a portion of data in a lookup table based on the determined locations of the unsatisfied check symbols.

19. The decoding circuitry of claim 18, wherein the lookup table comprises:
   a section value indexing a plurality of subtables of the lookup table; and
   a coefficient value indexing dimensions of a three-dimensional subspace.

20. The decoding circuitry of claim 19, wherein the lookup table further comprises data representations corresponding to the plurality of bit combinations, wherein each bit combination in the plurality is capable of producing the set of modified check symbol values.

* * * * *